US008723515B2

(12) United States Patent
Motz et al.

(10) Patent No.: US 8,723,515 B2
(45) Date of Patent: May 13, 2014

(54) VERTICAL HALL SENSOR CIRCUIT COMPRISING STRESS COMPENSATION CIRCUIT

(75) Inventors: Mario Motz, Wernberg (AT); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/541,863

(22) Filed: Jul. 5, 2012

(65) Prior Publication Data

US 2014/0009221 A1 Jan. 9, 2014

(51) Int. Cl.
*G01R 33/06* (2006.01)
(52) U.S. Cl.
USPC ............... 324/251; 324/117 H; 324/207.2
(58) Field of Classification Search
USPC ............... 324/117, 207.2, 251, 117 H
See application file for complete search history.

(56) References Cited

U.S. PATENT DOCUMENTS

| | | | |
|---|---|---|---|
| 4,929,993 | A | 5/1990 | Popovic |
| 5,253,532 | A * | 10/1993 | Kamens ............... 73/708 |
| 5,679,973 | A | 10/1997 | Mochizuki et al. |
| 6,441,460 | B1 * | 8/2002 | Viebach ............... 257/536 |
| 7,474,093 | B2 | 1/2009 | Ausserlechner |
| 7,872,322 | B2 | 1/2011 | Schott et al. |
| 7,980,138 | B2 | 7/2011 | Ausserlechner |
| 8,164,149 | B2 | 4/2012 | Schott |
| 2005/0230770 | A1 * | 10/2005 | Oohira ............... 257/421 |
| 2006/0011999 | A1 | 1/2006 | Schott et al. |
| 2008/0111565 | A1 | 5/2008 | Ausserlechner et al. |
| 2009/0108839 | A1 * | 4/2009 | Ausserlechner ........... 324/251 |
| 2010/0123458 | A1 | 5/2010 | Schott |
| 2010/0133632 | A1 | 6/2010 | Schott |
| 2012/0056609 | A1 * | 3/2012 | Satoh ............... 323/313 |

FOREIGN PATENT DOCUMENTS

| | | |
|---|---|---|
| EP | 0735600 A2 | 10/1996 |
| EP | 2071347 A2 | 6/2009 |
| EP | 2192417 A2 | 6/2010 |
| WO | 03036733 A2 | 5/2003 |
| WO | 2004025742 A1 | 3/2004 |

OTHER PUBLICATIONS

M. Banjevic: "High Bandwith CMOS Magnetic Sensors Based on the Miniaturized Circular Vertical Hall Device." Master Thesis Presented Sep. 9, 2011.

(Continued)

*Primary Examiner* — Reena Aurora
*Assistant Examiner* — Alexander J Nemtzow
(74) *Attorney, Agent, or Firm* — Eschweiler & Associates, LLC

(57) ABSTRACT

A vertical Hall sensor circuit includes an arrangement comprising a vertical Hall effect region of a first doping type, formed within a semiconductor substrate and having a stress dependency with respect to a Hall effect-related electrical characteristic. The vertical Hall sensor circuit further includes a stress compensation circuit which comprises at least one of a lateral resistor arrangement and a vertical resistor arrangement for generating a stress-dependent lateral resistor arrangement signal based on a reference signal provided to the stress compensation circuit, and for generating a stress-dependent vertical resistor arrangement signal based on the reference signal, respectively. The vertical Hall sensor circuit further includes a first circuit for providing a first signal to the arrangement based on at least one of the stress-dependent lateral resistor arrangement signal and the stress-dependent vertical resistor arrangement signal.

28 Claims, 21 Drawing Sheets

(56) References Cited

OTHER PUBLICATIONS

C. Schott: "Linearizing integrated Hall Devices." International Conference on Solid State Sensors and Actuators. Jun. 16-19, 1997.
T. Kaufmann et al: "Novel complying concept for five-contact vertical hall devices", Transducers 2011, pp. 2855-2858. Jun. 5-9, 2011.
J. Cesaretti, Master Thesis. Georgia Institute of Technology. May 2008.
M. Denieve et al: Reference magnetic actuator for self calibration of a very small Hall sensor array. Swiss Federal Institute of Technology. Jun. 11, 2001.
Tamuracorp. "Current Sensor Info." Retrieved from tamuracorp. com/products/current-sensor-info. Retreived on Apr. 27, 2012.
T. Kaufmann et al.: "Piezo-Hall effect in CMOS-based Vertical Hall Devices." Department of Microsystems Engineering (IMTEK) University of Freiburg Freiburg, Germany. IEEE Copyright 2011.
Michael Demierre. "Improvements of CMOS Hall Microsystems and Application for Absolute Angular Position Management." Sep. 2003.
R. Popovic "Hall devices for magnetic sensor systems",Transducers'97, pp. 377-380. International Conference on Solid State Sensors and Actuators. Jun. 16-19, 1997.
U.S. Appl. No. 13/530,235, filed Jun. 22, 2012.
U.S. Appl. No. 13/530,296, filed Jun. 22, 2012.

\* cited by examiner

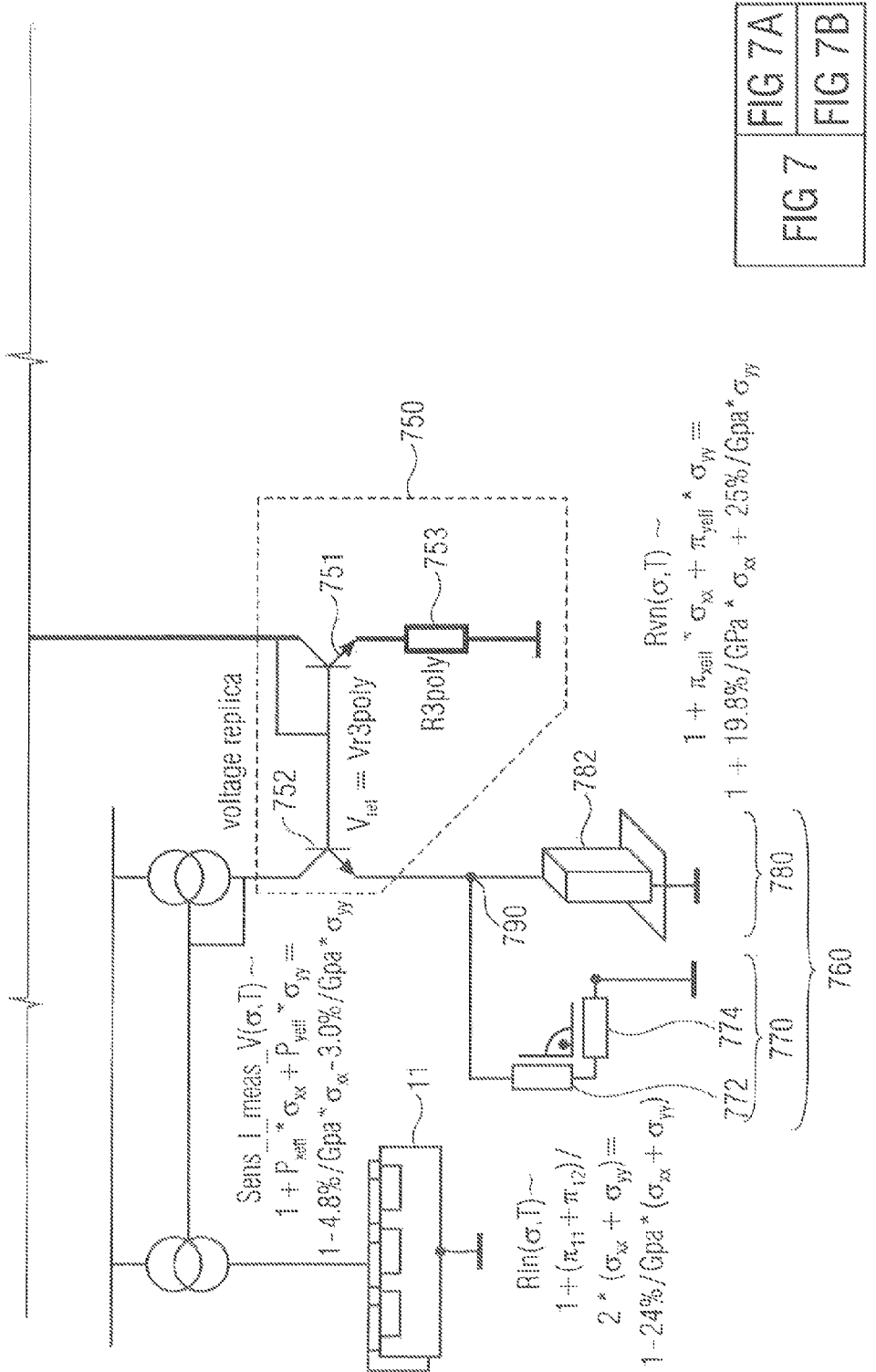

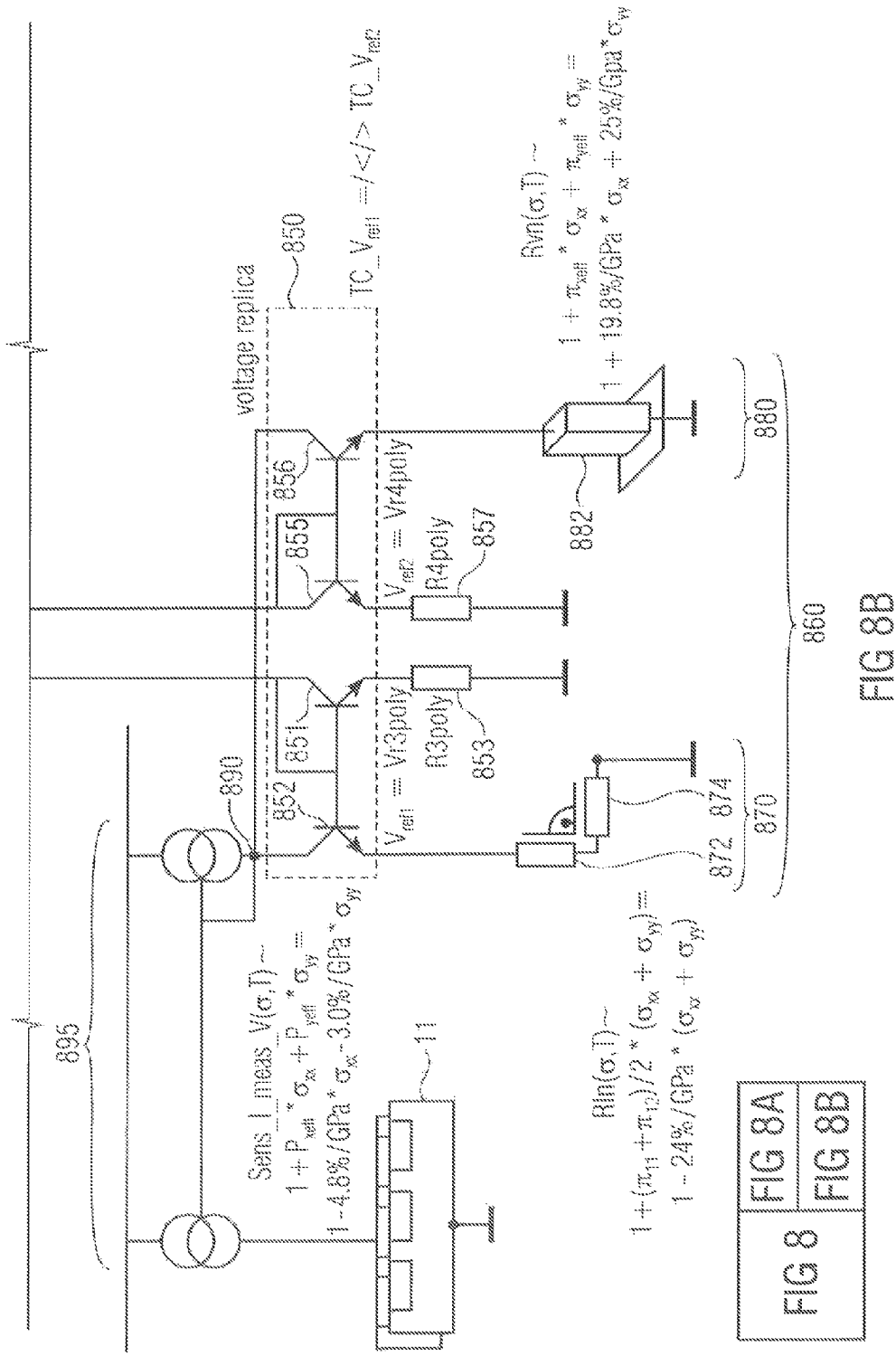

VERTICAL HALL SENSOR CIRCUIT COMPRISING STRESS COMPENSATION CIRCUIT

FIELD

Embodiments of the present invention relate to vertical Hall sensor circuits. Further embodiments of the present invention relate to a sensing method using a vertical Hall sensor circuit. Further embodiments of the present invention relate to stress compensation for vertical Hall sensors.

BACKGROUND

Integrated circuits (ICs) are typically mounted in packages to protect the sensitive integrated circuitries from environmental influences. However, one disadvantageous side effect that may be observed is that mounting the integrated circuitry in a package exerts mechanical stress on the semiconductor material. Mechanical stress on integrated circuits changes electronic parameters, such as the magnetic sensitivity of Hall plates or the resistance of resistors. Mechanical stress changes the mobility and the scatter factor of charge carriers, which causes lifetime drifts of resistances, transistor parameters, and the magnetic sensitivity of Hall plates (known as piezo-resistivity effect, piezo-MOS effect, piezo-junction effect, and piezo-Hall effect).

Lifetime drift of mechanical stress originates from changes of the thermomechanical properties of the package constituents (e.g. aging or chemical reactions in the mold compound or swelling of the mold compound due to moisture ingress), and typically cannot be avoided. Silicon Hall sensors are known to suffer from a long term drift in magnetic sensitivity between 1% and 4% depending upon the degree of moisture in the mold compound of the package.

Vertical Hall effect sensors are also affected by the lifetime drift of mechanical stress. Vertical Hall sensors differ from planar Hall sensors or "Hall plates" that vertical Hall sensors are capable of measuring surface-parallel components of the magnetic field. They allow therefore relatively easy conception of single-chip multi-axial magnetic sensors compared to solutions using horizontal Hall plates. The modern trend in the field of Hall sensors is to integrate them into electronic circuitry for signal processing. The great advantage of these vertical Hall-effect sensors is that they can be manufactured in a standard CMOS process without additional post-processing.

Hence, mechanical stress within the active region of a vertical Hall sensor may lead to a gain error over the lifetime of the Hall sensor caused by mechanical stress in vertical Hall sensors (caused by packaging, humidity changes, soldering, . . . ). As a result, a change of sensitivity and/or a change of switching points may be observable. Typically, it is relatively difficult or not possible at all to adjust for these changes by programming.

SUMMARY

Embodiments of the present invention provide a vertical Hall sensor circuit comprising an arrangement, a stress compensation circuit, and a first circuit. The arrangement comprises a vertical Hall effect region of a first doping type, formed within a semiconductor substrate and having a stress dependency with respect to a Hall effect-related electrical characteristic. The stress compensation circuit comprises at least one of a lateral resistor arrangement and a vertical resistor arrangement. The lateral resistor arrangement comprises a first resistive element and a second resistive element, parallel to a surface of the semiconductor substrate and orthogonal to each other, for generating a stress-dependent lateral resistor arrangement signal based on a reference signal provided to the stress compensation circuit. The vertical resistor arrangement comprises a third resistive element of the first doping type for vertically conducting an electric current flow, for generating a stress-dependent vertical resistor arrangement signal based on the reference signal. A first circuit is configured to provide a first signal to the arrangement, wherein the first signal is based on at least one of the stress-dependent lateral resistor arrangement signal and the stress-dependent vertical resistor arrangement signal.

Further embodiments of the present invention provide a vertical Hall sensor circuit comprising a vertical Hall effect region of a first doping type formed within a semiconductor substrate having a stress dependency with respect to a Hall effect-related electrical characteristic. The vertical Hall sensor circuit further comprises a stress compensation circuit for stress-dependent control of a supply signal supplied to the vertical Hall effect region. The stress compensation circuit comprises a lateral resistor arrangement, a vertical resistor arrangement, and a combiner configured to combine lateral and vertical contributions of an electrical quantity generated by the lateral and vertical resistor arrangements to an electrical output quantity of the stress compensation circuit. The lateral contribution has a first stress dependency and the vertical contribution has a second stress dependency of opposite sign and of different slope than the first stress dependency so that a combined stress dependency substantially compensates for the stress dependency of the vertical Hall effect region.

Further embodiments of the present invention provide a method for stress compensation of electrical power to be supplied to a vertical Hall effect region of a first doping type. The method comprises providing a reference signal to a stress compensation circuit that comprises a lateral resistor arrangement, a vertical resistor arrangement, and a signal combiner. The method also comprises generating a stress-dependent lateral resistor arrangement signal based on the reference signal using the lateral resistor arrangement comprising a first resistive element and a second resistive element parallel to a surface of the semiconductor substrate and orthogonal to each other. In a similar manner, a stress-dependent vertical resistor arrangement signal is generated based on the reference signal, wherein the vertical resistor arrangement comprises a third resistive element of the first doping type for vertically conducting an electric current flow. The method further comprises combining the stress-dependent lateral resistor arrangement signal and the vertical resistor arrangement signal to obtain a combination signal and supplying a supply signal to the vertical Hall effect region, wherein the supply signal is based on the combination signal.

Further embodiments of the present invention provide a method for stress compensation for a vertical Hall effect region of a first doping type. The vertical Hall effect region may be formed within the semiconductor substrate and have a stress dependency with respect to a Hall effect related electrical characteristic. The method comprises providing a reference signal to a stress compensation circuit that comprises at least one of a lateral resistor arrangement and a vertical resistor arrangement. The method further comprises generating a stress-dependent resistor arrangement signal based on the reference signal using at least one of the lateral resistor arrangement and the vertical resistor arrangement, the lateral resistor arrangement comprising a first resistive element and a second resistive element parallel to a surface of the semiconductor substrate and orthogonal to each other. The vertical resistor arrangement comprises a third resistive element of the first doping type for vertically conducting an electric current flow. The method also comprises providing a first signal to the vertical Hall effect region, wherein the first signal is based on the stress-dependent resistor arrangement signal.

Further embodiments of the present invention provide a sensor system comprising a vertical Hall effect device, a first resistive device, and a second resistive device. The vertical Hall effect device, the first resistive device, and the second resistive device are all formed or arranged in a common semiconductor substrate and arranged with a well-defined mechanical stress coupling. Active regions of the vertical Hall effect device, of the first resistive device, and of the second resistive device have the same conductivity type. The magnetic sensitivity of the vertical Hall effect device, a first resistance of the first resistive device, and a second resistance of a second resistive device are affected predominantly by a same mechanical stress component or a same combination of mechanical stress components. A stress dependency of the first and second resistive elements differs more than a temperature dependency of the first and second resistive elements. An output signal of the sensor system is based on a Hall effect signal provided by the vertical Hall effect device, on a first compensation signal provided by the first resistive device, and on a second compensation signal provided by the second resistive device, the output signal being responsive to a magnetic field parallel to a surface of the semiconductor substrate and substantially constant versus, or compensated with respect to, mechanical stress acting on the semiconductor substrate during normal operation.

BRIEF DESCRIPTION OF THE FIGURES

Embodiments of the present invention will be described using the accompanying figures, in which.

DETAILED DESCRIPTION

Before in the following embodiments of the present invention will be described in detail using the accompanying figures, it is to be pointed out that the same elements or elements having the same functionality are provided with the same or similar references numbers and that a repeated description of elements provided with the same or similar reference numbers is typically omitted. Hence, descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention will be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1A:
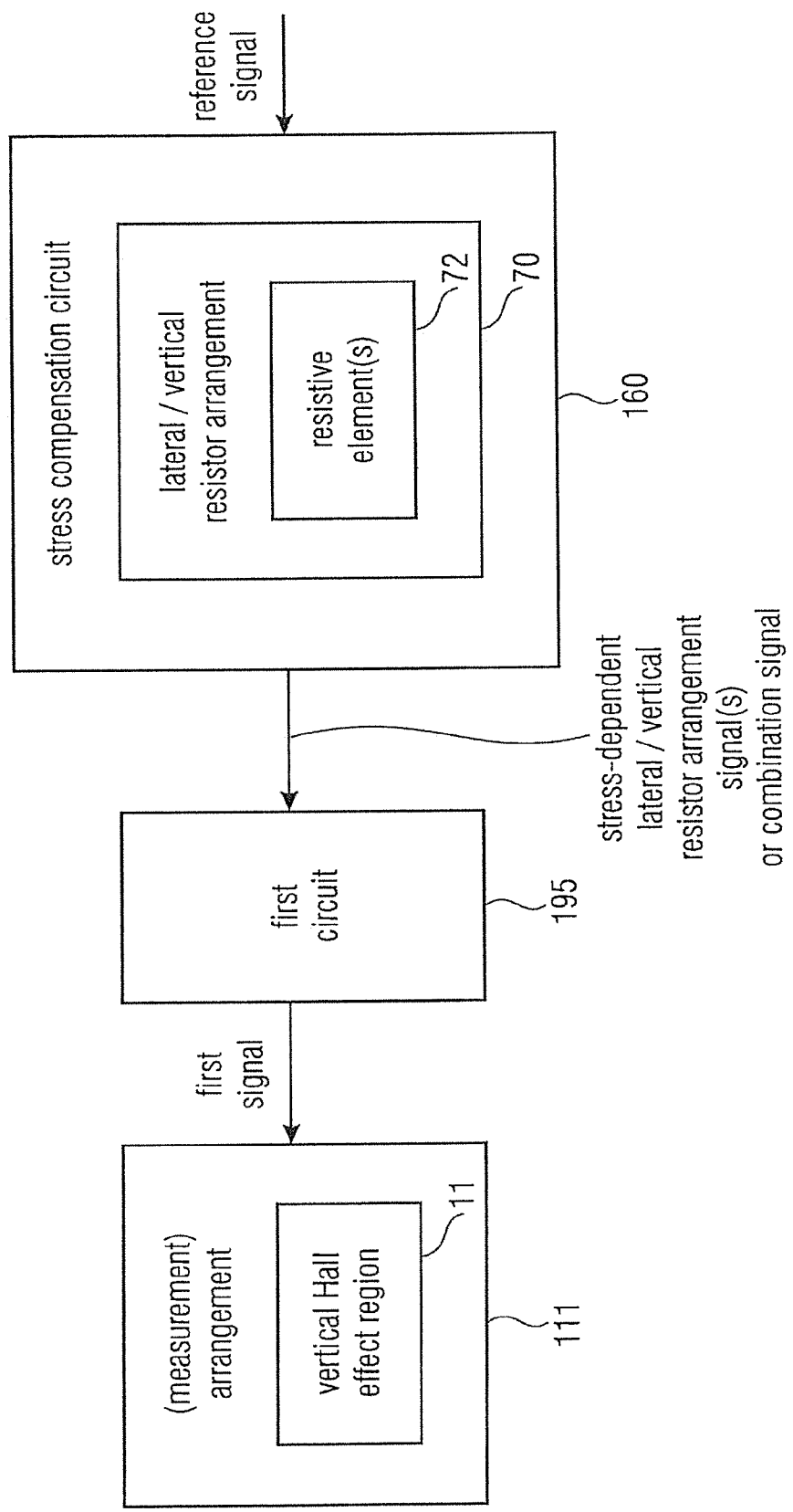
FIG. 1A shows a schematic block diagram of a vertical Hall sensor circuit according to embodiments.

FIG. 1A shows a schematic block diagram of a vertical Hall sensor circuit according to at least some embodiments. The vertical Hall sensor comprises an arrangement (measurement arrangement) 111 which itself comprises a vertical Hall effect region 11. The vertical Hall sensor circuit further comprises a stress compensation circuit 160 and a first circuit 195. The stress compensation circuit 160 is intended to compensate for a stress dependency of the vertical Hall effect region 11.

The vertical Hall effect region 11 is of a first doping type and formed within a semiconductor substrate in one embodiment. The first doping type may be an n-doping or a p-doping. The vertical Hall effect region 11 has a stress dependency with respect to a Hall effect-related electrical characteristic. In particular, the (supply) current-related sensitivity and/or the (supply) voltage-related sensitivity of the vertical Hall effect region 11 may be stress-dependent so that with increasing stress acting on the vertical Hall effect region 11 an increasing measurement error typically has to be expected within the measurement signal output by the vertical Hall effect sensor.

The stress compensation circuit 160 comprises at least one resistor arrangement 70. The resistor arrangement 70 is a lateral resistor arrangement or a vertical resistor arrangement. According to some embodiments, the stress compensation circuit 160 may comprise both a lateral resistor arrangement and a vertical resistor arrangement. The resistor arrangement comprises at least one resistive element 72. In case the resistor arrangement 70 is a lateral resistor arrangement, it may comprises a first resistive element and a second resistive element that are parallel to a surface of the semiconductor substrate and orthogonal to each other with respect to a main current flow direction through the first and second resistive elements. The first and second resistive elements may be configured to generate a stress-dependent lateral resistor arrangement signal based on a reference signal which is input to the stress compensation circuit 160. The resistor arrangement 70 may also be a vertical resistor arrangement comprising a resistive element (referred to as the "third resistive element" in this text for the sake of identification—this shall not imply that the first and second resistive elements of the lateral resistor arrangement are necessarily present when the stress compensation circuit comprises the third resistive element).

The stress-compensation circuit 160 is configured to receive a reference signal. The reference signal is applied to the at least one resistor arrangement in order to obtain a stress-dependent lateral resistor arrangement signal, a stress-dependent vertical resistor arrangement signal, or a stress-dependent combination signal. The stress-dependent signal provided by the stress compensation circuit 160 varies as a function of the stress acting on the resistor arrangement 70. The first circuit 195 may be regarded as a copying circuit, a replica circuit, a power supply circuit, or a conveyor circuit which provides a first signal as a (typically proportional or linear) function of the stress-dependent lateral/vertical resistor arrangement signal(s). The first signal may be a utility signal or a supply signal, such as a supply current or a supply voltage for the vertical Hall effect region 11. In other words, the first signal may be an electrical quantity (e.g., current or voltage) that is provided to the arrangement. In alternative embodiments the first signal may be a utility signal or a reference signal, such as a reference voltage or a reference current.

Figure 1B:
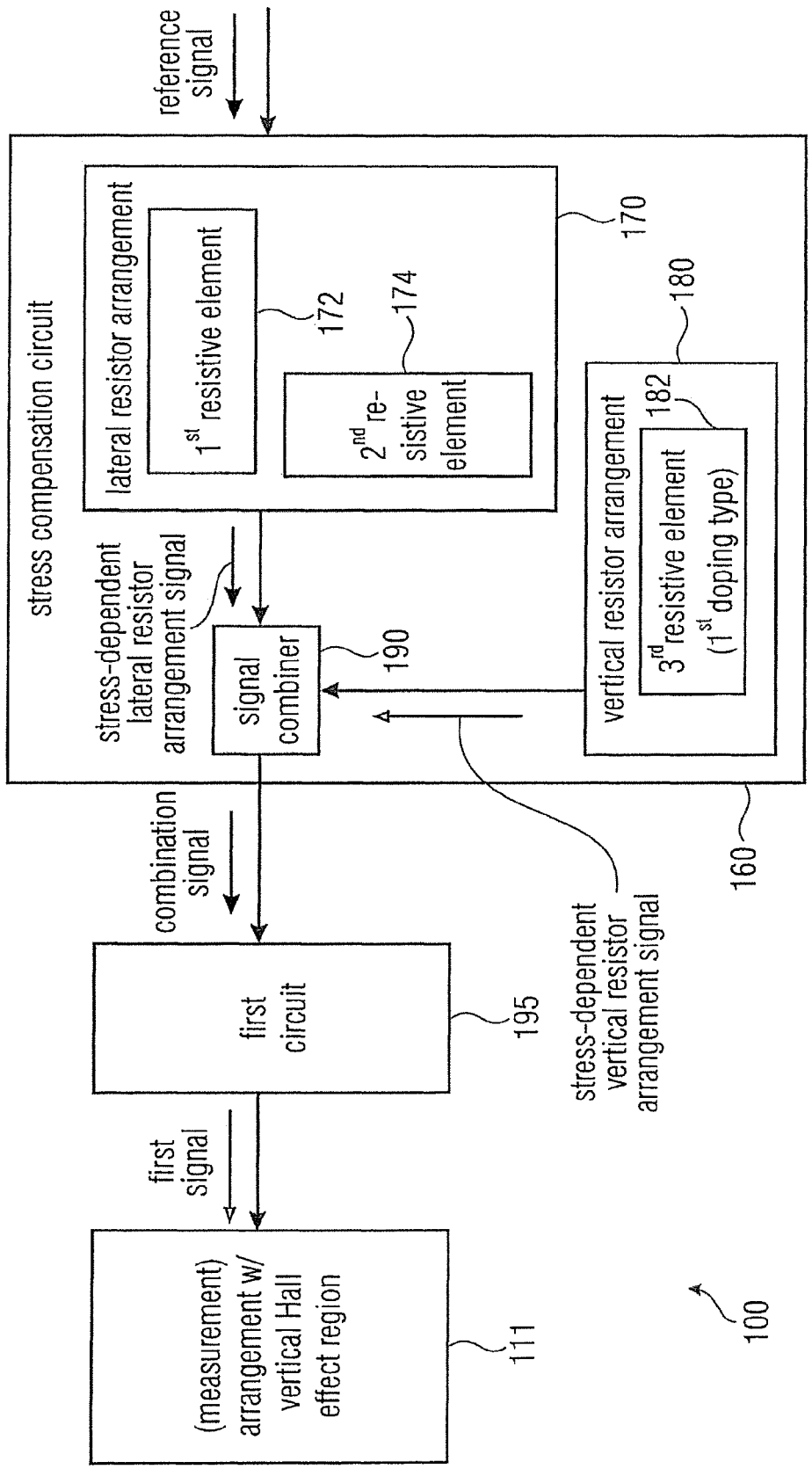
FIG. 1B shows a schematic block diagram of a vertical Hall sensor circuit according to further embodiments.

FIG. 1B shows a schematic block diagram of a vertical Hall sensor circuit (or Hall effect sensor circuit) 100 according to further embodiments. The vertical Hall sensor circuit 100 comprises the (measurement) arrangement 111, the stress compensation circuit 160, and the first circuit 195. The arrangement 111 comprises the vertical Hall effect region 11 as described above.

The stress compensation circuit 160 comprises a lateral resistor arrangement 170, a vertical resistor arrangement 180, and a signal combiner 190. The lateral resistor arrangement 170 comprises a first resistive element 172 and a second resistive element 174. The first and second resistive elements 172, 174 may typically be integrated within the semiconductor substrate and extend parallel to a surface of the semiconductor substrate. In other words, the first and second resistive elements 172, 174 may be obtained by locally modifying a conductivity of the semiconductor substrate, for example by means of chemical vapor deposition (CVD) or ion implantation. Each of the first and second resistive elements 172, 174 may be contacted by a pair of contacts which are spaced apart from each other in a lateral direction, i.e., in a direction parallel to the surface of the semiconductor substrate. Except for the contact, the first and second resistive elements 172, 174 are typically surrounded by semiconductor material having a lower conductivity than the resistive elements 172, 174 so that an electrical current flows substantially in the lateral direction through the respective resistive element. The first and second resistive elements 172, 174 are also orthogonal to each other with respect to their main current flow directions. Instead of being orthogonal to each other the first and second resistive elements 172, 174 may also be arranged oblique to each other with an angle other than 0°, 90°, 180°, and 270°. The first and second resistive elements 172, 174 are typically formed within the semiconductor substrate so that they are subjected to a mechanical stress within the semiconductor substrate or within a portion thereof. Furthermore, the first and second resistive elements 172, 174 may, at least in some embodiments, have a similar stress dependency and possibly respective anisotropy as the vertical Hall effect region 11, because they are formed in the same semiconductor substrate and therefore have the same crystal structure. Depending on the doping type and/or the doping level, the stress dependencies of the first and second resistive elements 172, 174 and may, in some embodiments, differ more or less from the stress dependency of the vertical Hall effect region 11. In a combined manner, the first and second resistive elements 172, 174 generate a stress-dependent lateral resistor arrangement signal based on a reference signal provided to the stress compensation circuit 160. In other words, depending on the mechanical stress acting on the lateral resistor arrangement 170, the stress-dependent lateral resistor arrangement signal varies even if the reference signal provided to the stress compensation circuit 160 remains substantially constant. The stress-dependent lateral resistor arrangement signal is provided to the signal combiner 190.

The vertical resistor arrangement 180 comprises a third resistive element 182 of the first conductivity type (e.g., typically n-doped, possibly p-doped). The third resistive element 182 is configured to conduct an electric current flow and generate a stress-dependent vertical resistor arrangement signal based on the reference signal. The stress-dependent resistor arrangement signal is also provided to the signal combiner 190. The third resistive element 182 may be contacted by a pair of contacts that are spaced apart from each other in a vertical direction, i.e., in a direction orthogonal to the surface of the semiconductor substrate. It is also possible that the pair of contacts is arranged, for example, at or near the semiconductor surface and that due to a vertically extending insulating element the current flow is conducted substantially along a U-path. Yet another option is that a conductive buried layer is present within the substrate so that the current flows in a vertical direction from a first contact to the buried layer, traverses the buried layer, and then flows substantially vertically through the substrate to the second contact. The vertically extending insulating element may thus insulate a first vertical resistor section from a second vertical resistor section in which the electric current flows in a substantially opposite direction. The third resistive element 182 may also comprise a conducting element such as (a portion of) an n-doped buried layer (nBL) which is located at a depth into the semiconductor substrate and electrically shorts the first and second vertical resistor sections. The stress dependency of the vertical resistor arrangement 180 is a function of lateral stress components occurring within the semiconductor substrate, just as the stress dependency of the lateral resistor arrangement 170. While both the stress dependencies of the lateral and the vertical resistor arrangement 170, 180 might be function of vertical stress components, as well, it is typically reasonable to neglect these vertical stress components in the case of relatively flat, thin semiconductor substrates, such as a semiconductor chip.

The signal combiner 190 is configured to receive the stress-dependent lateral resistor arrangement signal and the stress-dependent vertical resistor arrangement signal. The signal combiner 190 is further configured to generate a combination signal by combining the stress-dependent lateral resistor arrangement signal and the stress-dependent vertical resistor arrangement signal. For example, the stress-dependent lateral and vertical resistor arrangement signals may be electrical currents so that the signal combiner 190 may be configured to add the respective electrical currents provided by the lateral resistor arrangement 170 and the vertical resistor arrangement 180. In this case, the combination signal would be an electrical current. According to alternative embodiments, the combination signal, the stress-dependent lateral resistor arrangement signal, and the stress-dependent vertical resistor arrangement signal may be electrical voltages so that the signal combiner 190 is configured to combine a first electrical voltage and a second electrical voltage to obtain a third electrical voltage representing the combination signal.

The first circuit 195 functions in the embodiments according to FIGS. 1A and 1B as a Hall sensor supply circuit. Accordingly, the first signal may be regarded as a supply signal for the vertical Hall effect region. The first circuit 195 is connected to an output of the signal combiner 190 and configured to receive the combination signal from the signal combiner 190. The Hall sensor supply circuit 195 is further configured to supply a supply signal to the vertical Hall effect region 11. The supply signal is based on the combination signal. In this manner, the supply signal has a similar stress dependency as the combination signal. This stress dependency of the supply signal compensates at least partially for the stress dependency of the vertical Hall effect region.

Figure 2:
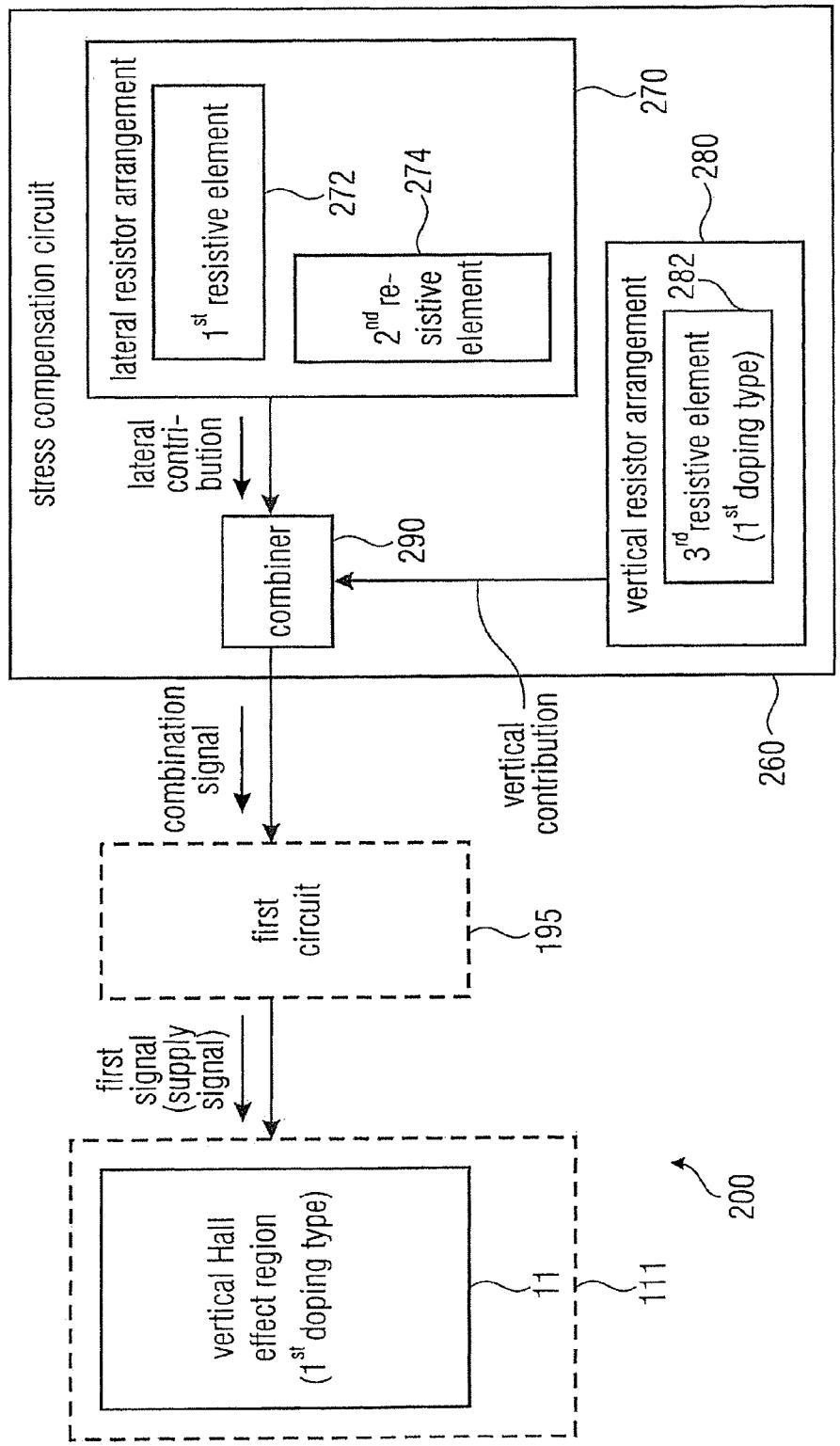
FIG. 2 shows a schematic block diagram of a vertical Hall sensor circuit according to further embodiments.

FIG. 2 shows a schematic block diagram of a vertical Hall sensor circuit 200 according to further embodiments. The vertical Hall sensor circuit 200 comprises a vertical Hall effect region 11 as a part of the (measurement) arrangement 111. The vertical Hall sensor circuit further comprises a stress compensation circuit 260. The first circuit 195 which has been described in the context of the embodiments shown in FIGS. 1A and 1B is also illustrated in FIG. 2. However, the first circuit 195 is optional in the embodiments relative to FIG. 2. In embodiments that do not comprise the first circuit 195, the combination signal may be used as the supply signal (first signal) for the vertical Hall effect region 11.

The vertical Hall effect region 11 is of a first doping type (e.g., n-doped or p-doped), formed within a semiconductor substrate, and has a stress dependency with respect to a Hall effect-related electrical characteristic.

The stress compensation circuit 260 is configured for stress-dependent control of the supply signal (first signal) which is supplied to the vertical Hall effect region 11. The stress compensation circuit 260 comprises a lateral resistor arrangement 270, a vertical resistor arrangement 280, and a combiner 290. The combiner 290 is configured to combine lateral and vertical contributions of an electrical quantity generated by the lateral and vertical resistor arrangement 270, 280. The lateral contribution has a first stress dependency and the vertical contribution has a second stress dependency of opposite sign and of different slope than the first stress dependency. As a result, a combined stress dependency of the combination signal substantially compensates or at least reduces the stress dependency off the vertical Hall effect region. In particular, the different signs and slopes of the stress dependencies of the lateral resistor arrangement 270 and vertical resistor arrangement 280 make it possible, by using a specific, predetermined weighting of the lateral and vertical contributions, to adjust the combined stress dependency so that it substantially compensates for the stress dependency of the vertical Hall effect region 11. Note that within the vertical Hall effect region 11, the electric current typically flows along arc-shaped trajectories and therefore comprises lateral as well as vertical directional components. This fact may be regarded as another reason for why an appropriately chosen combination of all the lateral and vertical contributions off the electrical quantity may efficiently compensate for the stress dependency off the vertical Hall effect region 11 within a large range of operating conditions, in particular regarding different directions and magnitudes of the various (lateral) stress components within the semiconductor substrate.

As illustrated in FIG. 2, the combination signal may be provided to the vertical Hall effect region 11 either directly or indirectly, via the Hall sensor supply circuit or conveyor 195.

The lateral resistor arrangement 270 is illustrated, in FIG. 2, as comprising a first resistive element 272 and a second resistive element 274 arranged in an L-shape. As in the embodiment illustrated in FIG. 1, the first and second resistive elements 272, 274 may extend in lateral directions, i.e., substantially parallel to the surface of the semiconductor substrate with their operative orientations, i.e., their main current flow directions. Furthermore, the operative orientations off the first and second resistive elements 272, 274 may be substantially orthogonal or at an angle to each other. The vertical resistor arrangement 280 is illustrated, in FIG. 2 as comprising a third resistive elements 282 of the first doping type, i.e., the same doping type and vertical Hall effect region 11, but not necessarily the same doping level in one embodiment.

According to embodiments, new horizons for stress compensation of vertical Hall effect sensors are made possible. For planar Hall plates, a memory used for digital post-processing and/or analog solutions may be used. However, no simple analog solutions appear to be known for vertical Hall sensors. Furthermore, stress compensation of planar Hall plates may require a calibration to compensate technology spreads.

Besides the stress compensation strategy proposed herein, mechanical stress feedback, feedback coils for sensitivity calibration, or closed-loop sensors may be used. However, mechanical stress feedback appears to suffer from difficult and unstable temperature compensation and technology spread compensation. The option of using feedback coils is related to reference magnetic actuators for self-calibration of a very small Hall sensor array. A high current consumption appears to be a drawback of this compensation technique. Also enclosed-loop sensors appear to suffer from a much too high current consumption and the drawbacks related to the coil which is used in this approach: saturation, hysteresis, package volume.

According to at least some embodiments a combination of currents is used which are generated by an L-shaped lateral resistor and a vertical n-doped resistor. This combination of currents is injected into a spinning vertical Hall effect region ("spinning" in the sense of the spinning current scheme which is used with Hall plates and vertical Hall sensors). In using a lateral and a vertical resistor, both may be mainly of the same type, for example with respect to doping type. According to some embodiments, the lateral resistor and the vertical resistor may also be of the same types (e.g., doping type) as the vertical Hall effect region. The combination current may be generated by parallel switching (parallel connection) of the lateral resistor(s) and the vertical resistor(s). For example, the combination current may be generated by summing of mainly lateral and mainly vertical currents.

According to some embodiments, the vertical Hall sensor circuit may comprise a replicon circuit, current mirrors, and/or regulated feedback circuits that may be used to apply a bias voltage for vertical Hall effect regions in that way, that a resulting stress dependent current (combination current) from lateral and vertical resistors substantially cancels the stress dependency off the (spinning) vertical Hall effect region(s).

According to some embodiments, an n-doped L-shaped bias resistor may be used that is formed in a way that a portion of a lateral resistor and a portion of a vertical resistor has a ratio to cancel the stress dependency of a (spinning) vertical Hall effect region. A stress-reduced bias current may be generated by, e.g., one or more p-diffusion L-shaped resistor(s) being part of, for example, the lateral resistor arrangement 170 or 270.

For the most part, the terms "vertical resistor" and "lateral resistor" means the following herein: a vertical resistor means that a big portion of current streamlines extends vertically and only a smaller part extends laterally or in a bow shaped. "Lateral resistor" means the opposite.

Figure 3:
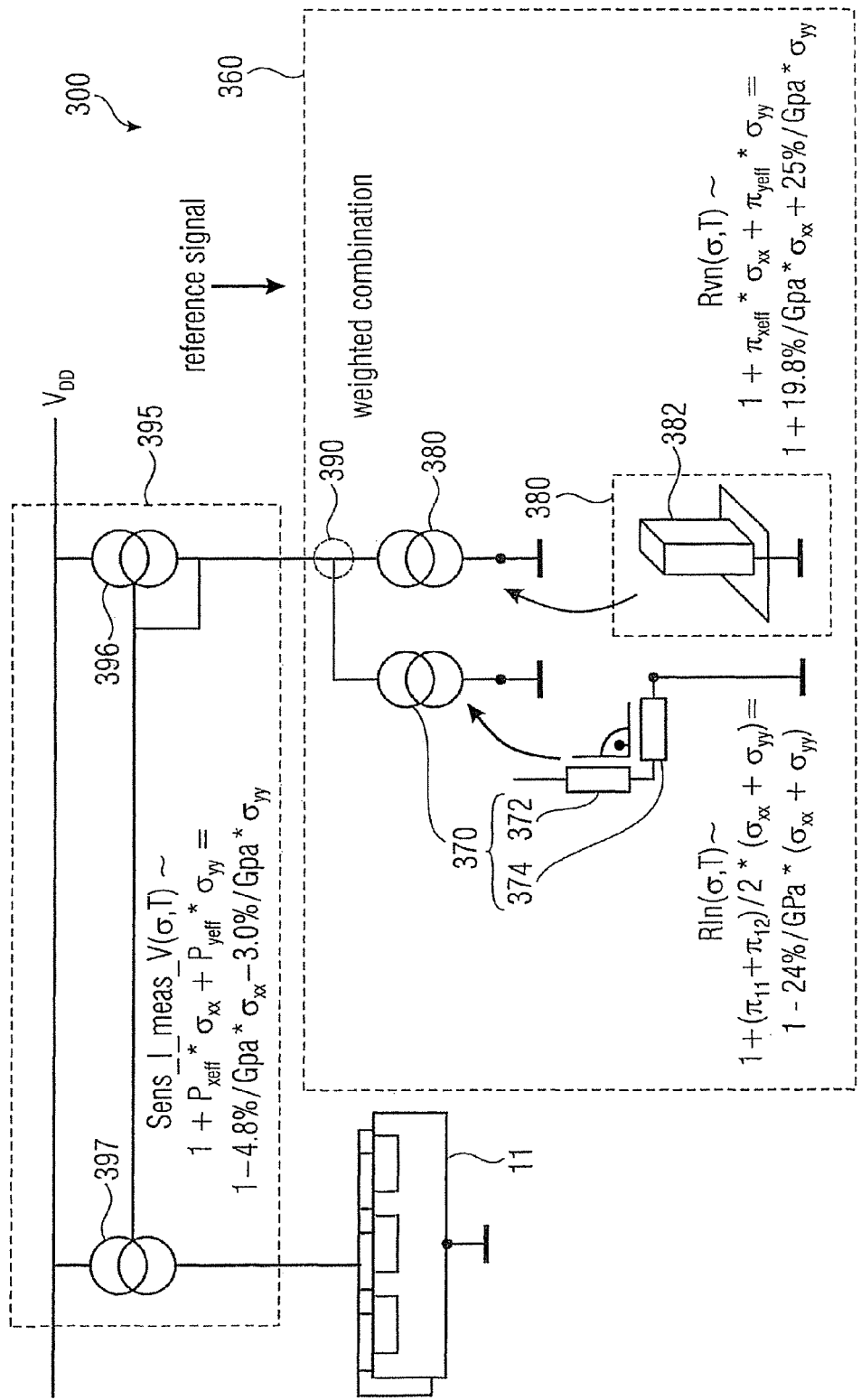
FIG. 3 shows a schematic circuit diagram of a vertical Hall sensor circuit according to embodiments, with n-doped, L-shaped lateral and n-doped vertical resistor arrangements.

By using embodiments the following may be achieved:
At the same time (without any individual trimming):
stress compensation for sensitivity drift
temperature compensation
technology spread compensation (+/−30% of Hall sheet resistance is compensated to 1 . . . 2%)
adjustable temperature-dependent stress compensation coefficient (independent from sensitivity temperature coefficient).
Furthermore, one or more of the following may also be achieved with at least some of the embodiments:
much less current consumption (in particular when compared to magnetic feedback)
much less package volume
small area
simple analog principle (does not need memory or digital signal processing)
much less fabrication and test costs
lower life-time and package drift and better quality of vertical Hall-sensor products FIG. 3 shows a schematic circuit diagram of a vertical Hall effect sensor 300 according to embodiments. Moreover, FIG. 5 also illustrates the basic principle: parallel switching (or summing up a current coming from) a lateral L-shaped resistor and (from) a vertical resistor.

The vertical Hall sensor circuit 300 comprises the vertical Hall effect region 11 (or several Hall effect regions as schematically illustrated in FIG. 3) that is/are part of the arrangement 111. The vertical Hall sensor arrangement further comprises the stress compensation circuit 360 and the Hall sensor supply circuit 395 (or first circuit). The vertical Hall effect region 11 has a relation between the supply current and the measurement voltage Sens_I_meas_V($\sigma$, T) that is stress-dependent and temperature-dependent. The relation between supply current and measurement voltage Sens_I_meas_V($\sigma$, T) is also called current-related sensitivity. Focusing on the stress dependency of the current-related sensitivity, the following proportionality relation can be assumed:

$$\text{Sens\_I\_meas\_V}(\sigma, T) \sim 1 + P_{xeff} * \sigma_{xx} + P_{yeff} * \sigma_{yy} ==$$
$$1 - 4.8\%/\text{GPa} * \sigma_{xx} - 3.0\%/\text{GPa} * \sigma_{yy}$$

wherein $P_{xeff}$ and $P_{yeff}$ are the effective piezo Hall coefficients in the x-direction and the y-direction, respectively, and $\sigma_{xx}$ and $\sigma_{yy}$ are the stress components in the x-direction and the y-direction, respectively. The designation "Sens_I_meas_V" indicates that the vertical Hall probe (or the vertical Hall effect region) is operated with a current biasing (i.e., with a current supply) and a voltage measurement.

The mechanical stress, or the mechanical strain, present in the semiconductor material of the semiconductor substrate and acting on the integrated circuitry is generally hard to reproduce because the mechanical stress depends on the combination of the materials used for the semiconductor substrate and for the sealing compound, and, in addition, on the processing parameters, such as the hardening temperature and hardening period of the sealing compound of the package of the integrated circuitry.

Various piezo effects present in the semiconductor material, such as the piezoresistive effect, piezo MOS effect, piezojunction effect, piezo Hall effect and piezo-tunnel effect, also influence important electrical and/or electronic parameters of the integrated circuitry due to mechanical stress of the integrated circuitry which is operating. In connection with the description below, the generic term "piezo effects" is to generally refer to the changes of electrical and/or electronic parameters of the circuitry integrated in the semiconductor material under the influence of mechanical stress in the semiconductor material.

Mechanical stress in the semiconductor material results in a change in the properties of the charge carriers with regard to the charge-carrier transport, such as mobility, collision time, scattering factor, Hall constant, etc.

In more general words, the piezoresistive effect determines how the specific ohmic resistance of the respective semiconductor material will behave under the influence of mechanical stress. The piezojunction effect results, among other things, in changes in the characteristics of diodes and bipolar transistors. The piezo Hall effect describes the dependence of the Hall constant of the semiconductor material on the mechanical stress condition in the semiconductor material.

The piezo-tunnel effect occurs at reversely operated, highly doped, shallow lateral pn junctions. This current is dominated by band-to-band tunnel effects and is also dependent on stresses.

The piezoresistive effect and the term "piezo MOS effect", which may occasionally be found in literature, are comparable, since with the piezo MOS effect, essentially just like with the piezoresistive effect, the mobility of the charge carriers in the MOS channel of an MOS field-effect transistor changes under the influence of the mechanical stress present in the semiconductor material of the integrated circuit chip.

It therefore becomes clear that due to mechanical stresses in the semiconductor material of an integrated circuitry, the electrical and/or electronic characteristics of the integrated circuitry could be changed, or negatively affected, in a non-predictable manner, a reduction in the performance, or parameter, of the integrated circuitry being noticeable, e.g., in the form of an impairment of the dynamic range, the resolution, the bandwidth, the power consumption or the accuracy etc.

Specifically, the above-mentioned piezoresistive effect indicates how the specific ohmic resistance $\rho$ of the respective semiconductor material behaves under the influence of a mechanical stress tensor $\sigma$ and of the piezoresistive coefficients $\pi$:

$$\rho = \rho_0(1 + \Sigma \pi_{i,j} \sigma_{i,j})$$

Here, factor $\rho_0$ is the basic value of the specific resistance which remains unaffected by the mechanical stress, and the value $\pi_{ij}$ is a piezoresistive coefficient.

In integrated circuits (ICs), the respective current I, e.g. a control current, a reference current etc., is generated by circuit elements of the integrated circuit on the semiconductor chip. Here, a defined voltage V is produced at an integrated resistor having the resistance R, and current I is decoupled. Current I may generally also be generated at any resistive element, e.g. also at a MOS field-effect transistor located in the linear operating range.

The voltage V may also be created, e.g., by known bandgap principles, in a manner which is relatively constant in relation to mechanical stresses in the semiconductor material (apart from the comparatively small piezojunction effect on the bandgap voltage produced). The resistance R, however, is subject to the piezoresistive effect in accordance with the following relationship:

$$R=R_0(1+\Sigma \pi_{i,j}\sigma_{i,j})$$

Here, factor $R_0$ is the basic value of the resistance, which remains unaffected by the mechanical stress, and the value $\pi_{ij}$ is the piezoresistive coefficient. Thus, the current I produced at the resistive element may be expressed as follows:

$$I=U/R=U/(R_0(1+\Sigma \pi_{ij}\sigma_{ij}))$$

If the mechanical pressure present on the semiconductor, and thus the mechanical stress present in the semiconductor may be subdivided into an essentially constant basic value $\sigma_{0ij}$ and a pressure fluctuation $\delta\sigma_{ij}$ which is mostly fairly small and is variable across operating conditions and service life, i.e. may be subdivided into $\sigma_{ij}=\sigma_{0ij}\pm\delta\sigma_{ij}$, the current may be expressed as follows, in linear approximation:

$$I=I_0(1+\Sigma \pi_{ij}\delta\sigma_{ij}) \text{ with}$$

$$I_0=U/(R_0(1+\Sigma \pi_{ij}\sigma_{0ij}))$$

It also becomes clear that the factor taken from the coefficient $\pi_{ij}$ and the pressure fluctuation $\delta\sigma_{ij}$ is problematic and could produce an interference with regard to current I generated, and should come as close to zero as possible.

Since mechanical stresses present in the semiconductor material have an impact on the semiconductor circuit chip, due to the package of the integrated circuitry, in a manner which is difficult to control, the resistance R used for generating current I, and therefore also current I which has been generated, are changed in an undesired and unpredictable manner.

The piezo Hall effect, in contrast, describes the dependence of the Hall constant $R_h$ on the condition of mechanical stress in the semiconductor material, with:

$$R_h=R_{h0}(1+\Sigma P_{i,j}\sigma_{i,j})$$

$\sigma_{ij}$ is the mechanical stress tensor, $P_{ij}$ are the piezo Hall coefficients, the summation extending across i=1 . . . 3 and j= 1 . . . 3 with the piezo Hall effect (and the piezoresistive effect).

Due to the piezo Hall effect, which occurs in the semiconductor material of the semiconductor chip of the integrated circuitry also as a result of mechanical stresses, the current-related sensitivity $S_i$ of the Hall probe changes as follows, e.g. in the case of a Hall probe array:

$$S_i = \frac{V_h}{I_H B} = \frac{R_h}{t}g$$

$V_h$ is the Hall voltage present at the output side of the Hall probe, $I_H$ is the current (control current) flowing through the Hall probe, B is the magnetic flux density to be detected, t is the effective thickness of the active layer of the Hall probe, and g is a geometry factor describing the influence of the contact electrodes on the Hall voltage.

As a result of the piezoresistive effect in the presence of mechanical stresses in the semiconductor material of the Hall-probe array, Hall current $I_H$ flowing through the Hall probe will change, since Hall current $I_H$ (control current) is defined, in addition, for example, only across a co-integrated resistance R where a voltage V is made to drop, possibly by means of a control loop. A change in the Hall current $I_H$ due to the change in the resistance as a result of the piezoresistive effect therefore leads to a change in the sensitivity S of the Hall probe, since the sensitivity S of the Hall probe is identical with the product of the current-related sensitivity $S_i$ times the Hall current $I_H$:

$$S=S_i I_H=U_h/B \propto S_i/R$$

The magnetic sensitivity of the Hall probe S may be defined (as indicated above) as the ratio of the output voltage $V_H$ of the Hall probe to the operating magnetic-field component B.

A mechanical stress present in the semiconductor material of the Hall-probe array therefore influences the current-related magnetic sensitivity $S_i$ of a Hall probe in accordance with $$S_i=S_{i0}(1+\Sigma P_{ij}\sigma_{ij})$$

Factor $S_{i0}$ is the basic value of the current-related magnetic sensitivity, which remains unaffected by the mechanical stress, and factor $P_{ij}$ is a piezo Hall coefficient.

Referring back to FIG. 3, the vertical Hall effect region 11 is supplied with electrical power by means of the Hall sensor supply circuit or first circuit 395. The Hall sensor supply circuit 395 comprises in one embodiment a current mirror which in turn comprises a first portion 396 and a second portion 397. The second portion 397 of the current mirror is connected, at an output side of the current mirror, to the vertical Hall effect region(s) 11. The first portion 396 of the current mirror is connected, at an input side of the current mirror, to the stress compensation circuit 360. Both the first and second portions 396, 397. The current mirror are also connected to a circuit supply potential (for example Vcc or $V_{DD}$). The first portion 396 of the current mirror constitutes a controlling part of the current mirror and a second portion 397 constitutes a following part of the current mirror. This means that the first portion 396 controls the second portion 397 so that an electrical current supplied to the vertical Hall effect region 11 is identical or proportional an electrical current flowing through the first portion 396.

The stress compensation circuit 360 comprises a lateral resistor arrangement 370 and a vertical resistor arrangement 380. The stress compensation circuit 360 further comprises a signal combiner 390 which is implemented as a circuit node in the embodiment schematically illustrated in FIG. 3. In FIG. 3, the lateral resistor arrangement 370 and the vertical resistor arrangement 380 are illustrated as current sources and also as illustrative symbols. In particular, the lateral resistor arrangement 370 may be part of a current source, and the vertical resistor arrangement 380 may be part of another current source. However, other implementations than current sources are also possible.

The lateral resistor arrangement 370 comprises the first resistive element 372 and the second resistive element 374 which extend in parallel to the surface of the semiconductor substrate and orthogonally to each other. As illustrated in FIG. 3, the first and second resistive elements 372, 374 are electrically connected in series. A total resistance Rln($\sigma$, T) of the lateral resistor arrangement 370 can be approximated as function of a sum of the lateral stress components $\sigma_{xx}$ and $\sigma_{yy}$:

$$Rln(\sigma, T) \sim 1 + (\Pi_{11} + \Pi_{12})/2 * (\sigma_{xx} + \sigma_{yy}) = 1 - 24\%/GPa * (\sigma_{xx} + \sigma_{yy})$$

In the nomenclature Rln the letter "l" indicates "lateral" and the letter "n" indicates "n-doped". For a p-doped lateral resistor arrangement 370, the constant $(\Pi_{11}+\Pi_{12})/2$ is typically different by about 24%.

The vertical resistor arrangement 380 comprises the third resistive element 382. The resistance $Rvn(\sigma, T)$ of the vertical resistor arrangement 380 can be approximated as a function of the individual lateral stress components $\sigma_{xx}$ and $\sigma_{yy}$:

$$Rvn(\sigma, T) \sim 1 + \Pi_{xeff} * \sigma_{xx} + \Pi_{yeff} * \sigma_{yy}) =$$
$$1 + 19.8\%/GPa * \sigma_{xx} + 25\%/Gpa * \sigma_{yy}$$

By adjusting the basic resistance values of the lateral resistor arrangement 370 and the vertical resistor arrangement 380, and/or by adjusting the sizes of the current sources to which the lateral resistor arrangement 370 and the vertical resistor arrangement 380 belong, a weighted combination of currents can be generated at a signal combiner 390. The electrical current output as the combination signal by the signal combiner 390 may thus have a stress dependency close to an inverse of the stress dependency off the vertical Hall effect region(s) 11 so that, by supplying a proportional supply signal (or more generally: first signal) to the vertical Hall effect region 11, the stress dependency of the vertical Hall effect region 11 may be substantially compensated or at least significantly reduced.

It can be shown that by using a certain ratio k for the combination of lateral and vertical bias currents, the sensitivity changes caused by mechanical stress can be substantially cancelled or at least significantly reduced in spinning vertical Hall effect sensors. Note however, that the reciprocal 1/(X) may be used, because I=V/R.

The combination of vertical and lateral bias current can be made by applying a reference voltage Vref which may be replicated from a bandgap voltage, for example.

It can further be shown that the temperature coefficient of the combined current $$I_{comb} = \frac{V_{ref}}{(R_{ln}(\sigma, T, R_{sq}) \| R_{vn}(\sigma, T, R_{sq})}$$

can compensate the stress dependency (and it's temperature coefficients) of the current-related sensitivity $$Sens\_I\_meas\_V(\sigma, T) \sim \sim 1 + P_{xeff} * \sigma_{xx} + P_{yeff} * \sigma_{yy} ==$$
$$1 - 4.8\%/GPa * \sigma_{xx} = 3.0\%/GPa * \sigma_{yy},$$

wherein $\sigma$ is the mechanical stress (tensor), T is the temperature, and Rsq is the sheet resistance of the semiconductor material. This will be explained in more detail below in the context of FIG. 11.

A technology spread of $Rln(\sigma, T, Rsq) Rvn(\sigma, T, Rsq)$ is related to the sheet resistance Rsq and can be compensated with the current-related sensitivity Sens_I_meas_V($\sigma$, T) because of the same (doping-) type of resistors and doping factor for the vertical Hall effect region 11 and the bias resistors 372, 374, 382. This will be explained in more detail below in the context of FIG. 12.

Figure 4:
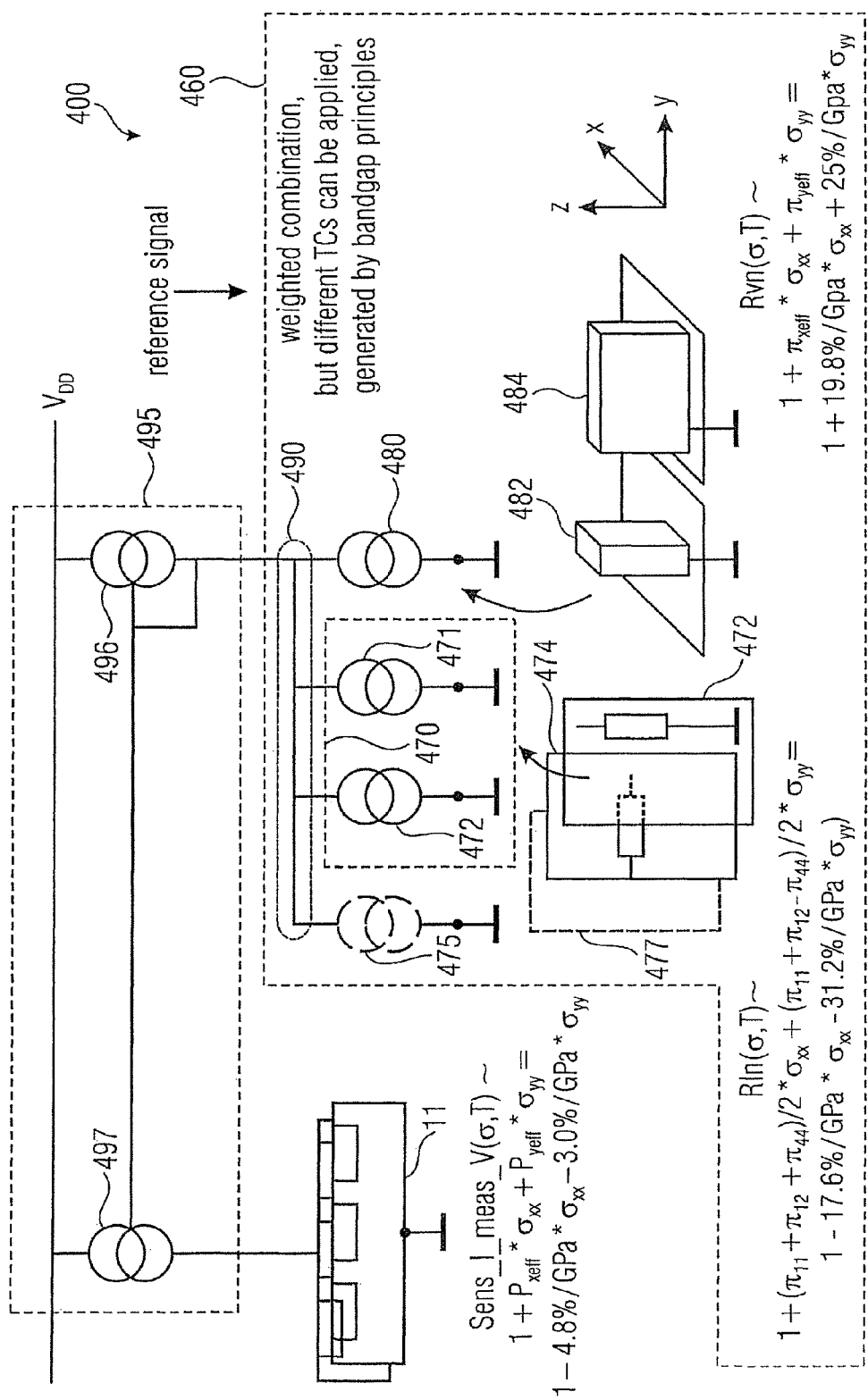
FIG. 4 shows a schematic circuit diagram of a vertical Hall sensor circuit according to further embodiments wherein also the n-doped vertical resistor arrangement is L-shaped.

FIG. 4 shows a schematic circuit diagram of a vertical Hall sensor circuit 400 according to some embodiments. The vertical Hall sensor circuit 400 comprises the vertical Hall effect region 11 (as part of the arrangement 111), the stress compensation circuit 460, and the Hall sensor supply circuit 495 (or first circuit). The vertical Hall effect region 11 and the Hall sensor supply circuit 495 are implemented in substantially the same manner as in the embodiment according to FIG. 3.

The stress compensation circuit 460 differs from the stress compensation circuit 360 of the embodiment in FIG. 3 in that the lateral resistor arrangement 470 comprises two current sources 471 and 472. A first current source 471 is associated and electrically connected to (or comprises) the first resistive element 472. A second current source 473 is associated and electrically connected to (or comprises) the second resistive element 474. In this manner, the following proportionality relation for the resistance of the lateral resistor arrangement 470 can be achieved:

$$Rln(\sigma, T) \sim 1 + (\Pi_{11} + \Pi_{12} + \Pi_{44})/2 * \sigma_{xx} + (\Pi_{11} + \Pi_{12} - \Pi_{44})/2 * \sigma_{yy} =$$
$$1 - 17.6\%/GPa * \sigma_{xx} - 31.2\%/GPa * \sigma_{yy}$$

The lateral resistor arrangement is configured to generate a stress-dependent lateral resistor arrangement signal based on a reference signal provided to the stress compensation circuit 460.

Another difference between the stress compensation circuit 360 in FIG. 3 and the stress compensation circuit 460 in FIG. 4 is that the vertical resistor arrangement 480 comprises a fourth resistive element 484 in addition to the third resistive element 482. The third and fourth resistive elements 482, 484 are arranged in an L-shape, i.e., orthogonal to each other. In particular, the third and fourth resistive elements 482, 484 have elongate cross-sections with respect to their operational orientation (i.e., their intended vertical current flow direction). In other words, the conductive channel provided by the third resistive element 482 is wider in a first direction (e.g., the x-direction) than in a second direction (e.g., the y-direction) orthogonal to the first direction. For the fourth resistive element 484 the conductive channel is wider in the second direction (e.g., the y-direction) than in the first direction (e.g., the x-direction). Indeed, although the main current flow direction through the third and fourth resistive elements 482, 484 is vertical (e.g., along or parallel to the z-direction), the fact that the cross-sections of the third and fourth resistive elements 482, 484 are elongated in different directions has an influence on the stress dependency of the third and fourth resistive elements 482, 484. The resistance of the vertical resistor arrangement 480 may again be expressed by the following proportional relation:

$$Rvn(\sigma, T) \sim 1 + \Pi_{xeff} * \sigma_{xx} + \Pi_{yeff} * \sigma_{yy}) =$$
$$1 + 19.8\%/GPa * \sigma_{xx} + 25\%/Gpa * \sigma_{yy}.$$

The stress compensation circuit 480 further comprises an optional, additional current source 475 and an optional, additional resistor arrangement 477 associated with the additional current source. For example, the additional resistor arrangement 477 may be p-doped (i.e., of the second doping type), which typically results in different piezo-electric characteristics and stress-dependency. Thus, the stress-dependency of the stress compensation circuit 460 can be further fine-tuned for more accurate stress compensation. The vertical resistor arrangement generates the stress-dependent vertical resistor arrangement signal based on the reference signal provided to the stress compensation circuit.

Using the signal combiner 490 (indicated by a dotted line in FIG. 4), a weighted combination of the currents generated by the various current sources 475, 472, 471, 480 and the associated or integrated resistive elements 477, 474, 472, 482, 484 can be performed. Accordingly, the signal combiner is configured to combine the stress-dependent lateral and vertical resistor arrangement signals to generate the combination signal which is then provided to the first portion 496 of the current mirror of the Hall sensor supply circuit 495 (first circuit).

Figure 5:
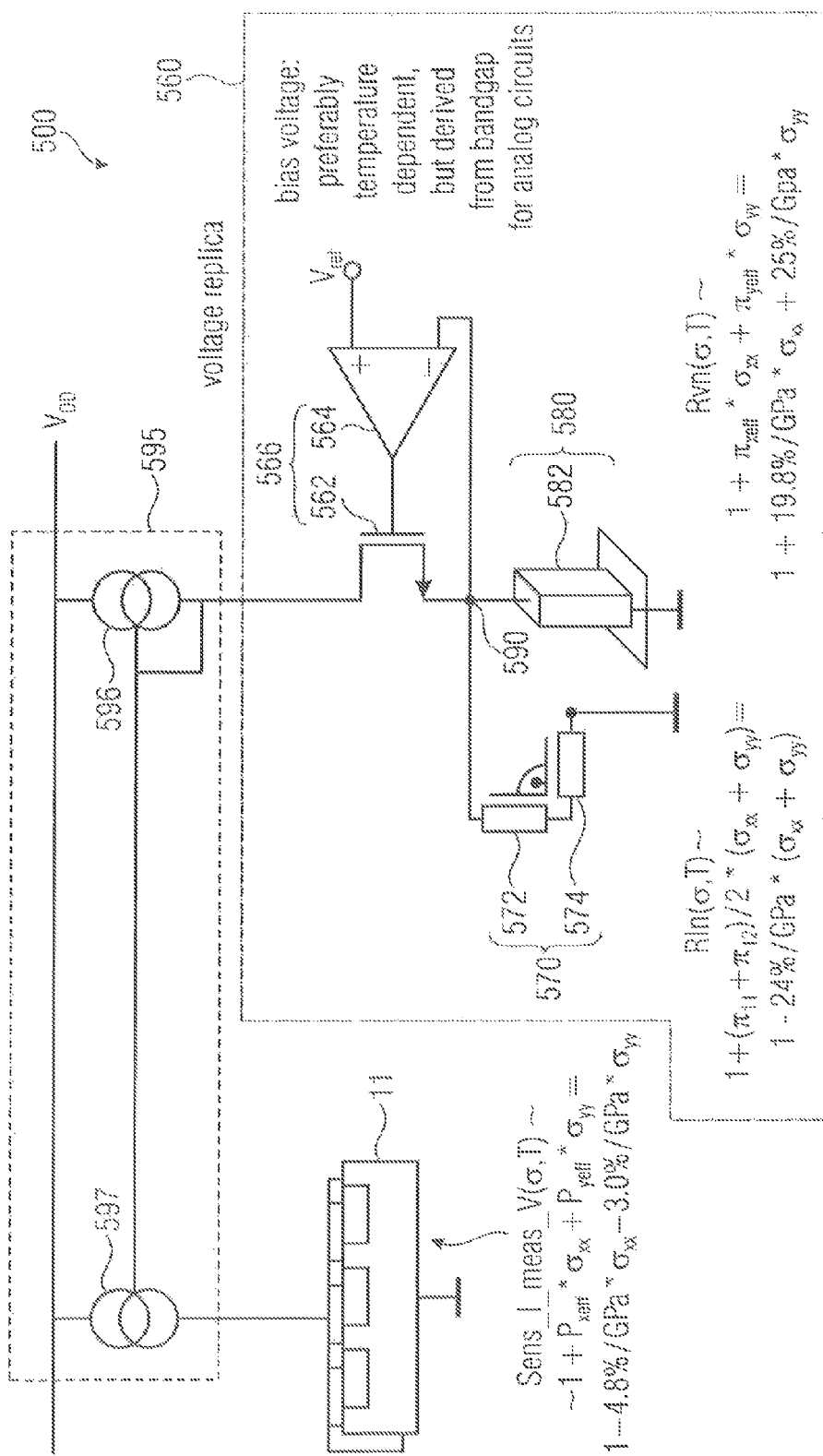
FIG. 5 shows a schematic circuit diagram of a vertical Hall sensor circuit according to further embodiments comprising a feedback-based voltage replica circuit.

FIG. 5 shows a schematic circuit diagram of a vertical Hall sensor circuit 500 according to further embodiments. The vertical Hall sensor circuit 500 comprises the vertical Hall effect region 11 (as part of the arrangement 111), the stress compensation circuit 560, and the Hall sensor supply circuit 595 (or first circuit). The vertical Hall effect region 11 and the Hall sensor supply circuit 595 are substantially identical to the corresponding elements shown in FIGS. 3 and 4. The Hall sensor supply circuit 595 comprises the first and second portions 596 and 597 of the current mirror. As in the embodiment shown in FIG. 3, the lateral resistor arrangement 570 comprises the first resistive element 572 and the second resistive element 574. The vertical resistor arrangement 580 comprises the third resistive element 582.

The stress compensation circuit 560 differs from the previously presented implementations in that it comprises a voltage replica in the form of a regulated feedback circuit 566. Hence, FIG. 5 illustrates a concept for stress compensation for a vertical Hall sensor using a bandgap principle and replica circuits. The regulated feedback circuit 566 comprises an operational amplifier 564 and a field effect transistor 562, in the present case an n-channel metal-oxide-silicon field effect transistor (MOSFET). A gate terminal of the field effect transistor 562 is connected to an output of the operational amplifier 564. An inverting input ("−") of the operational amplifier 564 is connected to the circuit node which functions as the signal combiner 590. A non-inverting input ("+") of the operational amplifier 564 is connected to a reference voltage Vref which serves as the reference signal. The reference voltage (or bias voltage) may be (for example) temperature-dependent but derived from a bandgap circuit for analog circuits. As the operational amplifier 564 attempts to minimize a difference of the electrical potentials of its inverting input and its non-inverting input, the MOSFET 562 is controlled by the output of the operational amplifier 564 to conduct more or less current until the electrical potential at the circuit node of the signal combiner 590 is substantially equal to the reference voltage. In this manner, the combined current (i.e., the combination signal) that flows through the MOSFET 562 and also through the parallel connection of the lateral resistor arrangement 570 and the vertical resistor arrangement 580 is controlled by the voltage drop across this parallel connection. The voltage drop across the parallel connection of the lateral and vertical resistor arrangements is, however, stress-dependent. The stress dependencies of the lateral and vertical resistor arrangements are indicated by the proportional relations in FIG. 5 and have been discussed above in the context of the description of FIG. 3. The combined current is then used as an input by the Hall sensor supply circuit 595 (first circuit) and mirrored (possibly scaled, depending on the mirror ratio of the current mirror) to the vertical Hall effect region 11. The vertical Hall effect region 11 uses the mirrored (and possibly scaled) current as supply current.

It follows that the combined current (comb can be expressed as a function of the reference voltage Vref:

$$I_{comb} = \frac{V_{ref}}{(R_{ln}(\sigma, T, R_{sq}))||(R_{vn}(\sigma, T, R_{sq}))}$$

The combination of vertical and lateral bias currents can thus be made by applying the reference voltage Vref (for example, replicated from a bandgap voltage).

The following Table 1 summarizes, for a first clock phase of a spinning current scheme, the stress dependencies of several electrical quantities and properties of the vertical Hall effect region 11, namely the internal resistance Ri, voltage-related sensitivity Su, current-related sensitivity Si, and common mode voltage Ucm. The indicated numbers are valid for a n-doped silicon vertical Hall effect region 11. Two normal stress components $\sigma_{xx}$ and $\sigma_{yy}$ and one shear stress component $\sigma_{xy}$ are considered. The normal stress component in the z-direction (not indicated in Table 1) is typically small and does not have a strong influence on the stress dependency of the vertical Hall device. The shear stress component $\sigma_{xy}$ is typically small and therefore negligible, too, in most practical applications, in particular if the semiconductor substrate is relatively thin.

TABLE 1

| | clock phase 1: | | | |
|---|---|---|---|---|
| stress component | Ri | Su | Si | Ucm |
| $\sigma_{xx}$ | 11.6%/GPa | −16.6%/GPa | −4.8%/GPa | 8.6%/GPa |
| $\sigma_{yy}$ | 18.0%/GPa | −21.0%/GPa | −3.0%/GPa | 7.3%/GPa |
| $\sigma_{xy}$ (shear) | 4.0%/GPa | −20.9%/GPa | −17.0%/GPa | −0.8%/GPa |

For a particular vertical Hall effect region the following basic values apply during clock phase 1:

$Su=44.84 V/V/T$ $Si=81.07 V/A/T$ $Ri=1818$ ohm

Figure 6A:
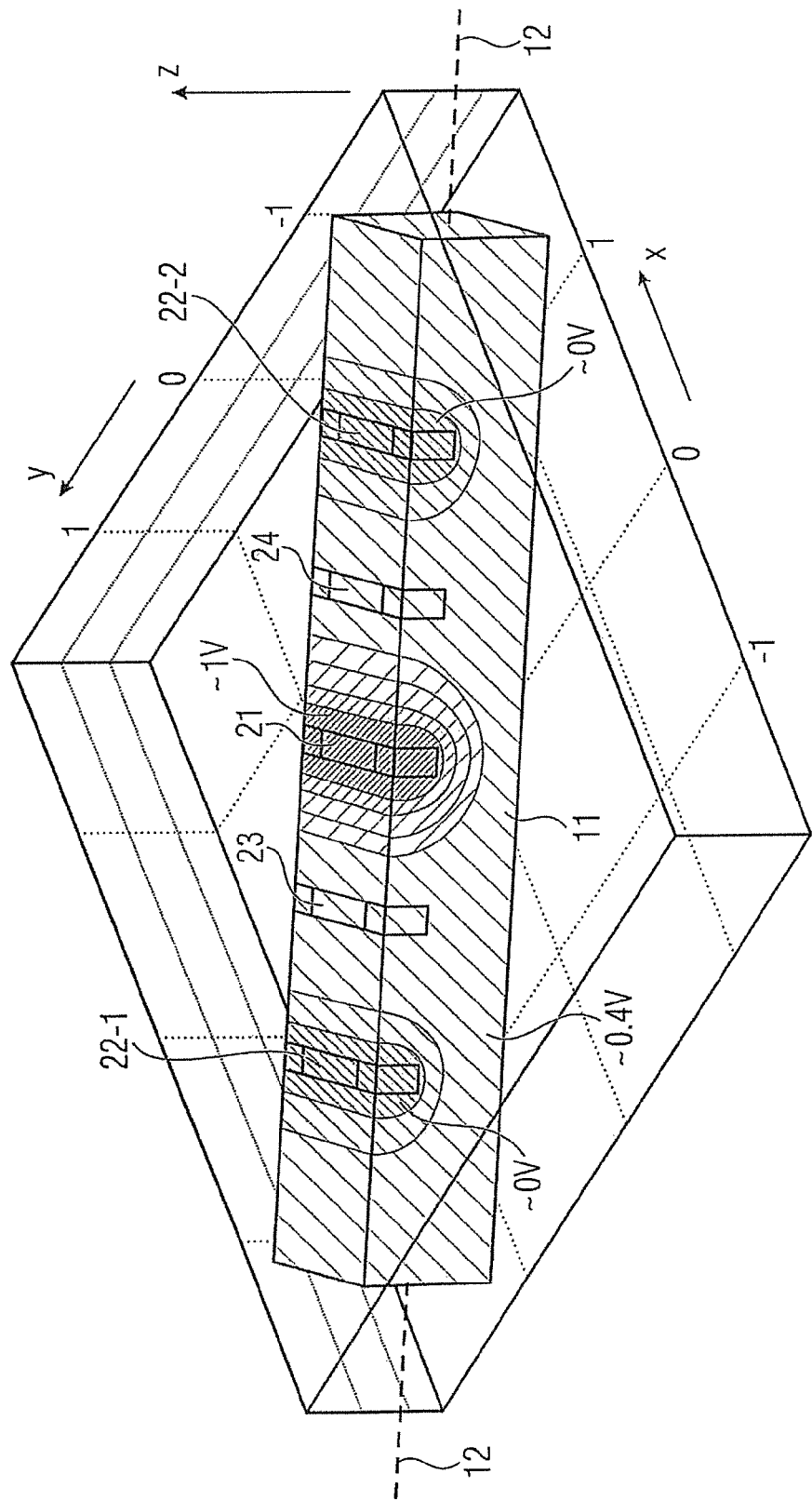
FIG. 6A illustrates an electrical potential distribution within a vertical Hall effect region during a first clock phase of a spinning current scheme.

FIG. 6A schematically illustrates the distribution of the electrical potential within the vertical Hall effect region 11 (part of the arrangement 111) during clock phase 1. Different hatchings indicate regions of different electrical potential. During clock phase 1, the supply current enters the vertical Hall effect region 11 at a center contact 21 and leaves the vertical Hall effect region 11 at two outmost contacts 22-1, 22-2. The contacts 23 and 24 are used as sense contacts between which a Hall voltage resulting from the supply current and a magnetic field parallel to the surface of the substrate and orthogonal to the longitudinal axis 12 (indicated by a dashed line in FIG. 6A) of the vertical Hall effect region 11 can be measured. Assuming a supply voltage of 1V, the electrical potential will be close to 1V in the vicinity of contact 21 (referred to the contacts 22-1, 22-2 which serve as ground contacts). In the vicinity of ground contacts 22-1 and 22-2 the electrical potential is close to 0V. During the first clock phase (clock phase 1), the current within the vertical Hall effect region 11 follows mostly the vertical direction, in particular is a highly conductive buried layer is present beneath the vertical Hall effect region 11.

The following Table 2 summarizes, for a second clock phase of the spinning current scheme, the stress dependencies of the several electrical quantities and properties of the vertical Hall effect region 11.

TABLE 2 clock phase 2:

| stress component | Ri | Su | Si | Ucm |
|---|---|---|---|---|
| $\sigma_{xx}$ | 8.3%/GPa | −13.4%/GPa | −4.8%/GPa | 0.0%/GPa |
| $\sigma_{yy}$ | 15.2%/GPa | −18.4%/GPa | −3.0%/GPa | 0.0%/GPa |
| $\sigma_{xy}$ (shear) | 4.3%/GPa | −21.1%/GPa | −17.0%/GPa | 0.0%/GPa |

Figure 6B:
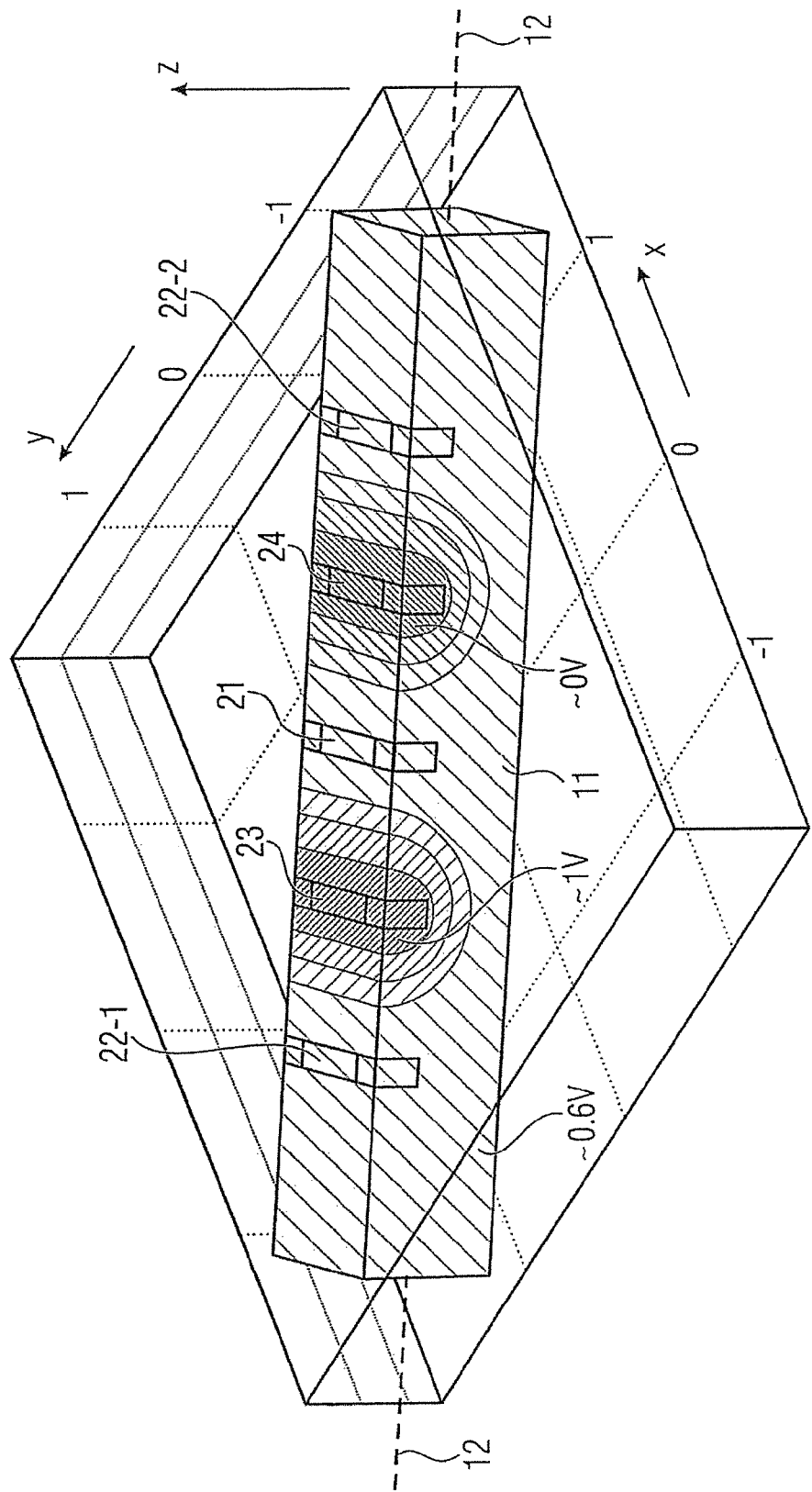
FIG. 6B illustrates an electrical potential distribution within a vertical Hall effect region during a second clock phase of a spinning current scheme.

FIG. 6B schematically illustrates the distribution of the electrical potential within the vertical Hall effect region 11 during clock phase 2. During clock phase 2, the supply current enters the vertical Hall effect region 11 at the contact 23 and leaves the vertical Hall effect region 11 at the contact 24. The contacts 21, 22-1, and 22-2 are used as sense contacts between which a Hall voltage resulting from the supply current and a magnetic field parallel to the surface of the substrate and orthogonal to the longitudinal axis 12 (indicated by a dashed line in FIG. 6A) of the vertical Hall effect region 11 can be measured. In particular, an output signal of the vertical Hall effect region 11 can be obtained at the center contact 21 during clock phase 2.

For the same vertical Hall effect region 11 that has been used in Table 1 and FIG. 6A, the following basic values apply for the voltage-related sensitivity, the current-related sensitivity, and the internal resistance:

$Su=34.42 V/V/T$ $Si=81.09 V/A/T$ $Ri=2369$ ohm

By comparing the values for clock phase 1 and clock phase 2 it can be seen that the voltage-related sensitivity and the internal resistance vary relatively strongly between clock phases. The current-related sensitivity, however, does not vary substantially.

Figure 7A:
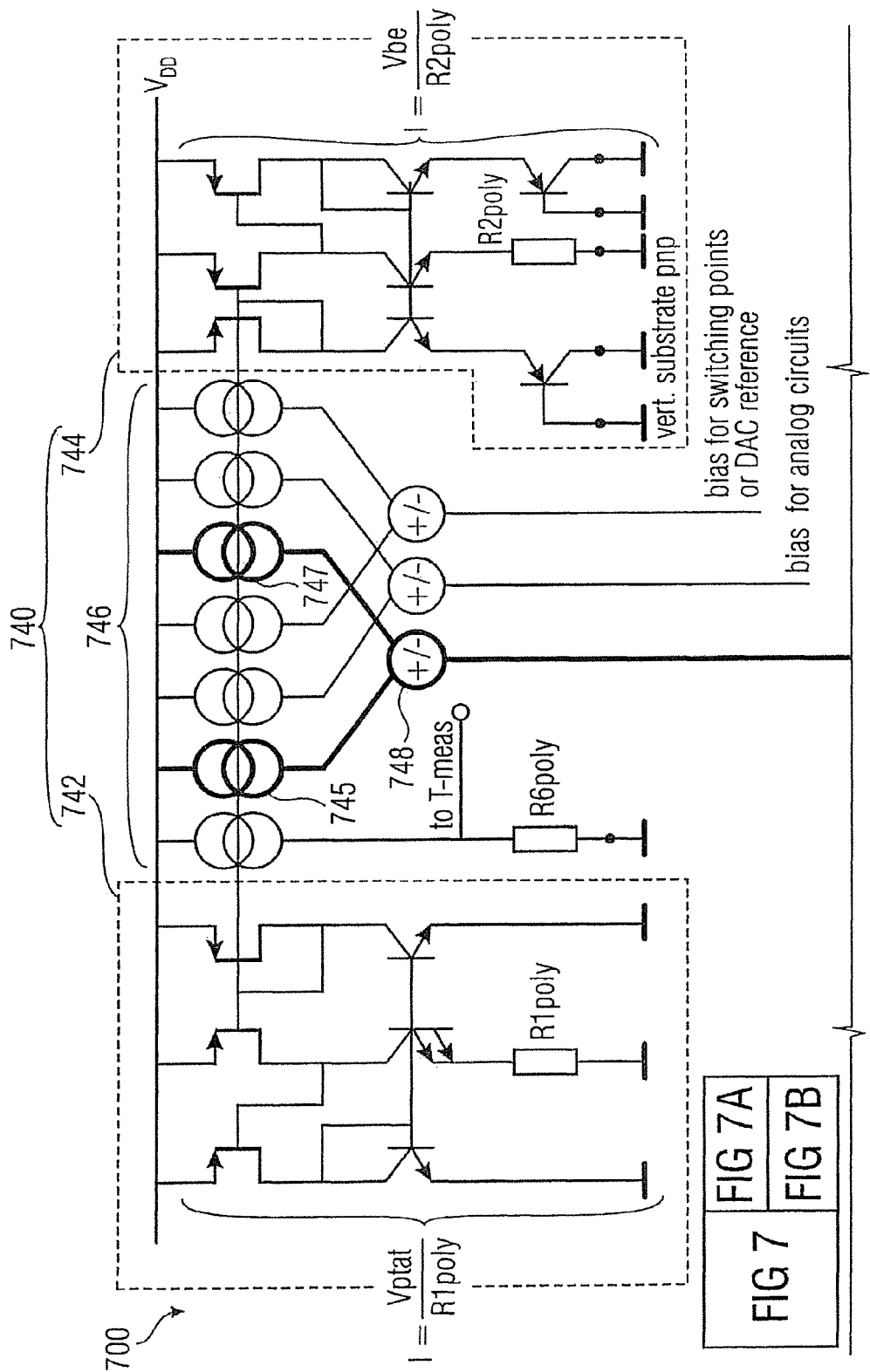
FIG. 7 shows a schematic circuit diagram of a vertical Hall sensor circuit according to further embodiments comprising a temperature compensation circuit.

FIG. 7 shows a schematic circuit diagram of a vertical Hall sensor circuit 700 according to embodiments that comprises a temperature compensation circuit. FIG. 7 illustrates a concept for stress compensation for vertical Hall sensors using bandgab principle and replica circuits.

The vertical Hall sensor circuit 700 shown in FIG. 7 comprises a temperature compensation circuit 740 for providing the reference signal as a temperature-dependent electrical quantity to the stress compensation circuit 760. In particular, the temperature compensation circuit 740 provides a reference current which is converted into a reference voltage using a resistor 753 ("R3poly"). The resistor 753 may be, for example, a polycrystalline resistor within the semiconductor substrate. Polycrystalline resistors typically have a relatively low stress dependency so that the voltage Vr3poly dropped across the resistor 753 is nearly independent (or at least very weakly dependent) from stress. The voltage Vr3poly across the resistor 753 is replicated to an input of the stress compensation circuit 760 using a voltage replica circuit 750. The voltage replica circuit 750 comprises a first transistor 751 and a second transistor 752. In the embodiment illustrated in FIG. 7 both transistors 751, 752 are bipolar npn-transistors. Other types of transistors may also be used in alternative embodiments, e.g., MOSFETs. In the embodiment of FIG. 7 the voltage replica circuit 750 also comprises the resistor 753. Alternatively, the resistor 753 or an equivalent component/sub-circuit may be provided in a manner separate from the voltage replica circuit 750. Depending on a stress-related instantaneous resistance of the parallel connection of the lateral and vertical resistor arrangements 760, 770, the current flowing through the transistor 792 and the node 790 varies as a function of the stress within the lateral and vertical resistor arrangements.

The temperature compensation circuit 740 comprises a PTAT (proportional-to-absolute-temperature) reference 742, a Vbe reference 744, a plurality of controlled current sources 746, and at least one temperature compensation signal combiner 748. The Vbe reference 744 is also known as "the bandgap reference" and has a negative temperature coefficient which is achieved by an appropriate sizing of the components that constitute the Vbe reference 744. Accordingly, the Vbe reference 744 may also be referred to as a negative-to-absolute-temperature (NTAT) reference (also known as: "complementary-to-absolute-temperature" (CTAT)). In alternative embodiments one or both of the PTAT reference circuit 742 and the Vbe reference circuit 744 may be replaced by other reference circuit designs having a positive or negative temperature coefficient, respectively.

The PTAT reference 742 and the Vbe reference 744 are based on the known bandgap principle or bandgap circuits and used to provide a combination of voltages with positive temperature coefficient (approximately 3333 ppm/K at 27° C. (300° K) for the PTAT reference 742 and negative temperature coefficient (approximately −2.2 mV/K for the base-emitter voltage of 600 mV at 27° C. (300° K), which leads to approximately −3033 ppm/K at 27° C.). These temperature-dependent voltages generated using the bandgap principle can be "mirrored out" or replicated with the aid of current mirrors or replica circuits to other resistors and/or circuits. These other resistors may be n-Epi resistors which have their own temperature coefficient, from which a quotient in the temperature behavior results in the resulting currents (supply current(s) or reference current(s)): dl=dU/dR.

The voltage $V_{PTAT}$ appears across the resistor R1 poly of the PTAT reference 742. In the Vbe reference 744 the voltage Vbe with negative temperature coefficient appears across the resistor R2poly. Using the resistor R6poly an amplified PTAT voltage is generated out of R1poly, via current mirroring. This amplified voltage can be used, for example, for temperature measurement purposes in digital systems having analog-to-digital converters in order to provide an additional temperature compensation.

Using a vertical pnp transistor within the Vbe branch provides a voltage Vbe that is particularly insensitive to stress (for the purpose of obtaining voltages and currents with negative temperature coefficient).

The output voltage of the PTAT reference 742 is provided as a control signal to at least one (voltage) controlled current source of the plurality of controlled current sources 746. In a similar manner the output voltage of the Vbe reference 744 is provided as a control signal to at least one other controlled current source 747 of the controlled current sources 746. The currents output by the controlled current sources 745 and 747 are combined using the temperature compensation signal combiner 748. Depending on a desired behavior of the temperature coefficient of the combined temperature compensated current, the currents output by the controlled current sources 745, 747 may be added or subtracted from each other. The vertical Hall sensor circuit 700 schematically shown in FIG. 7 comprises further controlled current sources and temperature compensation signal combiners which may be used to distribute a temperature compensated reference signal to other parts of an electronic system to which the vertical Hall sensor circuit 700 belongs. For example, a second temperature compensated reference current may be provided as a bias for further analog circuits. A third temperature compensated reference current may be provided as a bias for switching points or as a DAC (digital-to-analog converter) reference.

The combined temperature compensated current output by the temperature compensation signal combiner 748 is provided to the voltage replica circuit 750. The resulting reference voltage Vref for the stress compensation circuit 760 is temperature-dependent but largely independent from stress.

FIG. 7 may also be described as follows: the temperature compensation circuit 740 comprises a proportional-to-absolute-temperature circuit 742, a negative-to-absolute-temperature circuit 744, a first controlled current source 745, a second controlled current source 747, a current combiner 748, and a first portion 751, 753 of a voltage replica circuit 750. The first controlled current source 745 is configured to receive a temperature-proportional signal from the proportional-to-absolute-temperature circuit 742 as a control input and generate, based on the control signal, a first temperature-dependent current to be provided to the current combiner 748. The second controlled current 747 source is configured to receive a temperature-negative signal from the negative-to-absolute-temperature circuit 744 as a control input and generate, based on this control signal, a second temperature-dependent current to be provided to the current combiner 748, as well. A combined temperature-dependent current generated by the current combiner 748 based on a combination of the first and second temperature-dependent currents has a substantially and/or approximately opposite temperature dependency than the vertical Hall effect region 11 (part of the arrangement 111). The combined temperature-dependent current is provided to the stress compensation circuit 760 using the first portion 751, 753 of the voltage replica circuit 750. A second portion 752 of the voltage replica circuit 750 is part of the stress compensation circuit 760.

The first portion 751, 753 of the voltage replica circuit 750 belonging to the temperature compensation circuit 740 is connected to a reference potential (i.e., ground) by a polycrystalline resistor 753 ("R3poly") having a low or negligible stress dependency. The second portion 752 of the voltage replica circuit 750 belonging to the stress compensation circuit 760 is connected to the reference potential (i.e., ground) by the lateral resistor arrangement and the vertical resistor arrangement.

Figure 8A:
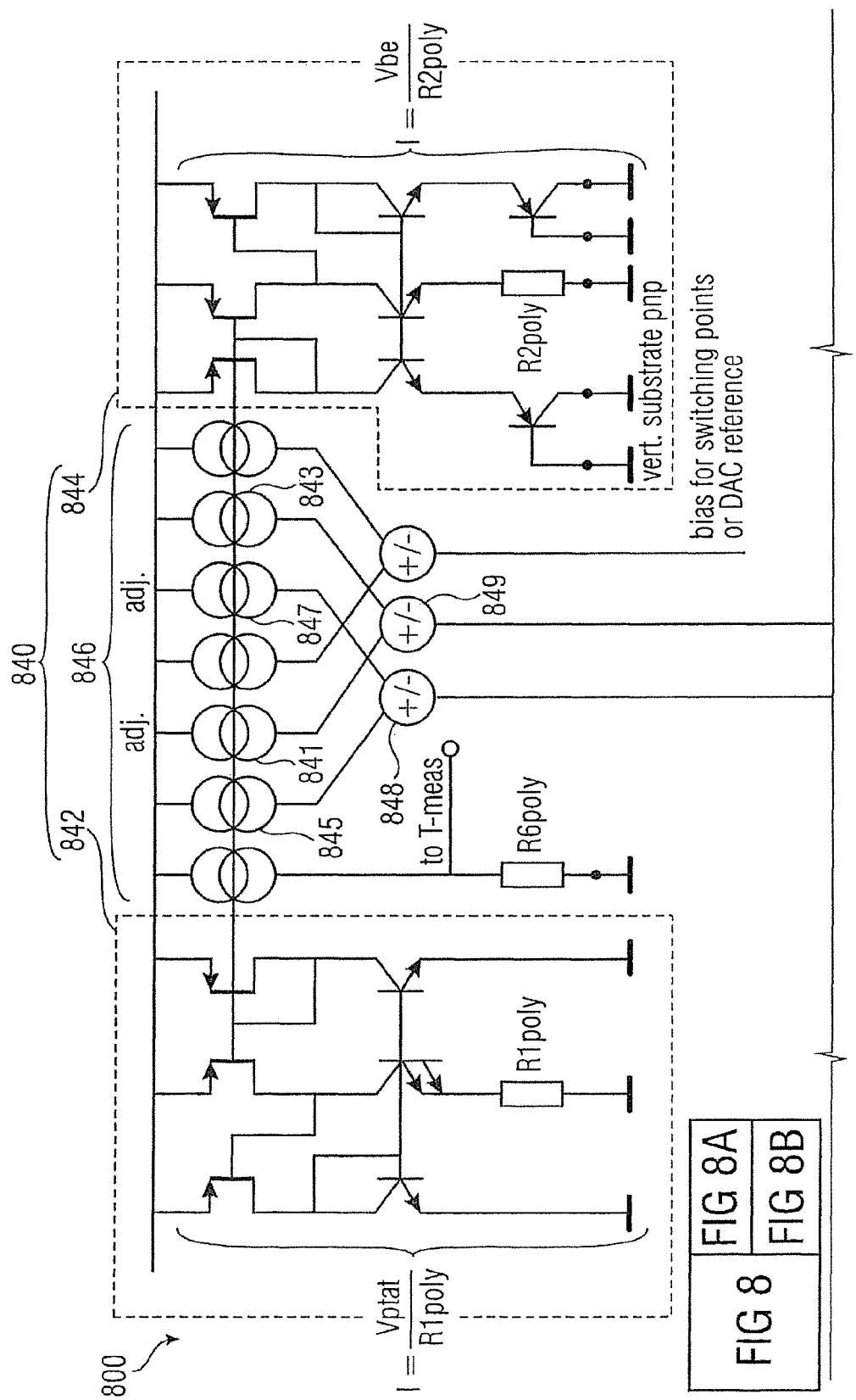
FIG. 8 shows a schematic circuit diagram of a vertical Hall sensor circuit according to further embodiments wherein the lateral and vertical resistor arrangements are individually temperature-compensated.

FIG. 8 shows a schematic circuit diagram of a vertical Hall sensor circuit 800 according to some further embodiments. The vertical Hall sensor circuit 800 implements a concept for stress compensation for vertical Hall sensors using a bandgap principle and replica circuits with a determined temperature-dependent stress compensation coefficient. With these embodiments, typically no individual adjustment of manufactured units of the vertical Hall sensor circuit 800 is needed. Moreover, in FIG. 8 different temperature dependent reference voltages are applied to the vertical and lateral stress dependent resistors (vertical and lateral resistor arrangements 880, 870). In doing so, the resulting stress dependent bias current for the vertical Hall effect region 11 (part of the arrangement 111) changes its stress dependency over temperature, but remains independent from technology spreads. The ratio typically needs to be found only once during the design and conception of the vertical Hall sensor circuit 800.

The vertical Hall sensor circuit 800 comprises the vertical Hall effect region 11, the Hall sensor supply circuit or first circuit 895, the stress compensation circuit 860, the voltage replica circuit 850, and the temperature compensation circuit 840. These components are basically known from the embodiments shown in FIG. 7.

The stress compensation circuit 860 comprises the lateral resistor arrangement 870 and the vertical resistor arrangement 880. The lateral resistor arrangement 870 comprises the first and second resistive elements 872, 874. The vertical resistor arrangement comprises the third resistive element 882. The temperature compensation circuit 840 comprises the PTAT reference 842, the Vbe reference 844, the plurality of controlled current sources 846, and the plurality of temperature compensation signal combiners 848, 849. The plurality of controlled current sources 846 comprises seven controlled current sources, four of which are identified by the reference numerals 841, 843, 845, and 847. The voltage replica circuit 850 comprises two substantially identical branches, each branch comprising a first portion (on a temperature compensation circuit side, i.e., input side of the voltage replica circuit) and a second portion (on a stress compensation circuit side, i.e., output side of the voltage replica circuit). The first branch comprises a first transistor 851 and a resistor 853 ("R3poly") that constitute the first portion, and a second transistor 852 that constitutes the second portion. The second branch comprises a first transistor 855, and a resistor 851 that constitute the first portion of the second branch, and a second transistor 856 that constitutes the second portion of the second branch. On an input side the first branch is connected to the temperature compensation signal combiner 848 and on an output side the first branch is connected to the lateral resistor arrangement 870. As to the second branch of the voltage replica circuit 850, it is connected, on an input side, to the temperature compensation signal combiner 849. At an output side the second branch is connected to the vertical resistor arrangement 880. In this manner, the voltage replica circuit 850 provides an individual branch for the lateral resistor arrangement 870 and for the vertical resistor arrangement 880. The two currents flowing through the transistors 852 and 856 are combined at the signal combiner to provide the combination signal which is then mirrored to the vertical Hall effect region 11 using the current mirror 895.

With this configuration shown in FIG. 8 it is possible to provide different reference signals to the lateral resistor arrangement 870 and to the vertical resistor arrangement 880. The temperature compensation signal combiners 848 and 849 can be individually trimmed or adjusted so that different weightings of the PTAT reference current and of the Vbe reference current can be implemented for the lateral and vertical resistor arrangements 870, 880. In particular, the temperature coefficients of the combined reference currents can thus be individually adjusted for the lateral and vertical resistor arrangements 870, 880. For example, it is possible to weigh the PTAT reference current stronger than the Vbe reference current in the combined reference current that is supplied to the lateral resistor arrangement 870, whereas for the combined reference current supplied to the vertical resistor arrangement 880 the opposite may be true.

The embodiment of FIG. 8 also makes it possible to make the degree of stress compensation dependent from the temperature: At low temperatures a strong stress compensation shall be performed, while at higher temperatures a weak stress compensation shall be performed.

Figure 9A:
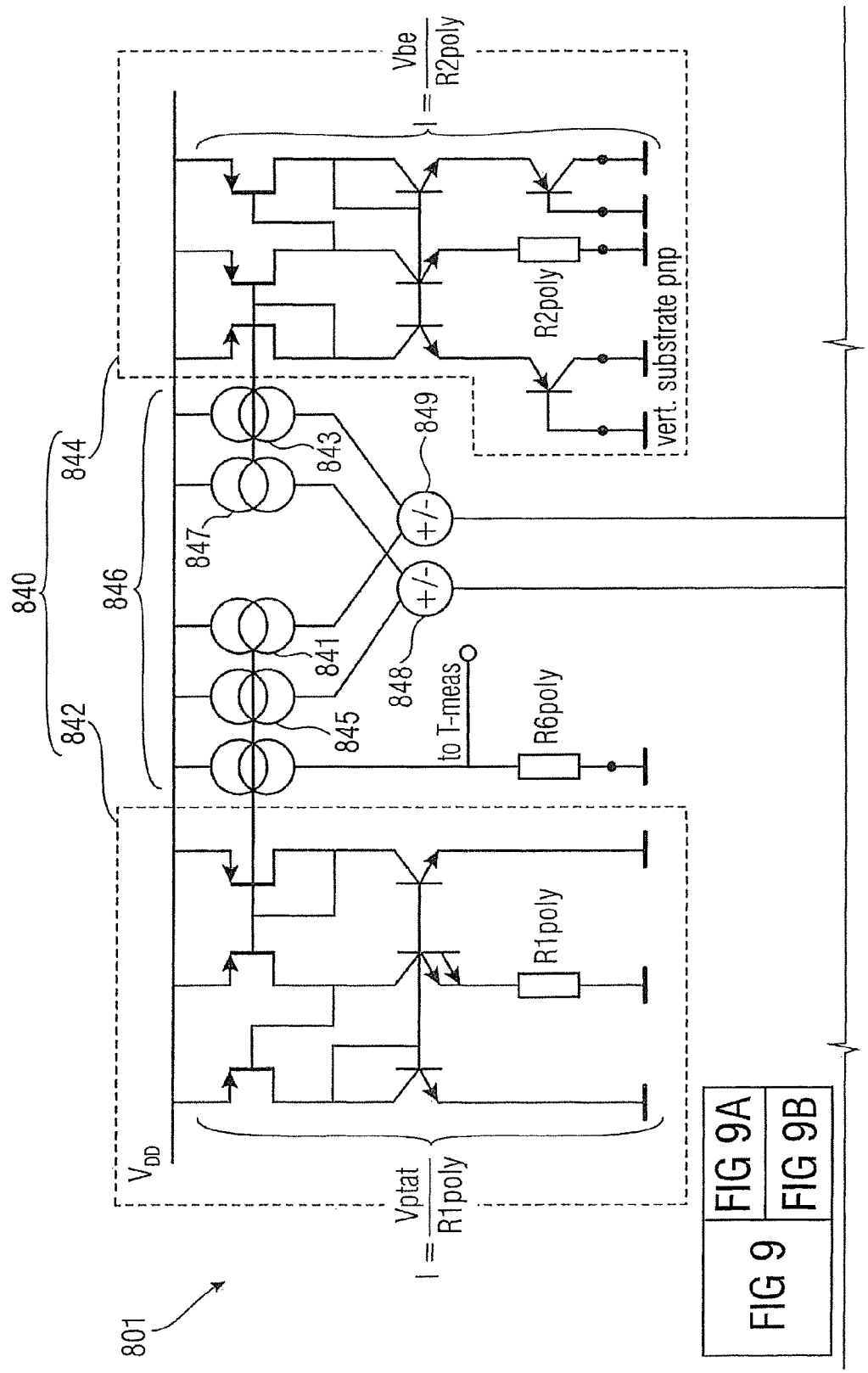
FIG. 9 shows a schematic circuit diagram of a vertical Hall sensor circuit according to further embodiments wherein the first signal is provided to an analog-to-digital converter of the arrangement.
Figure 9B:
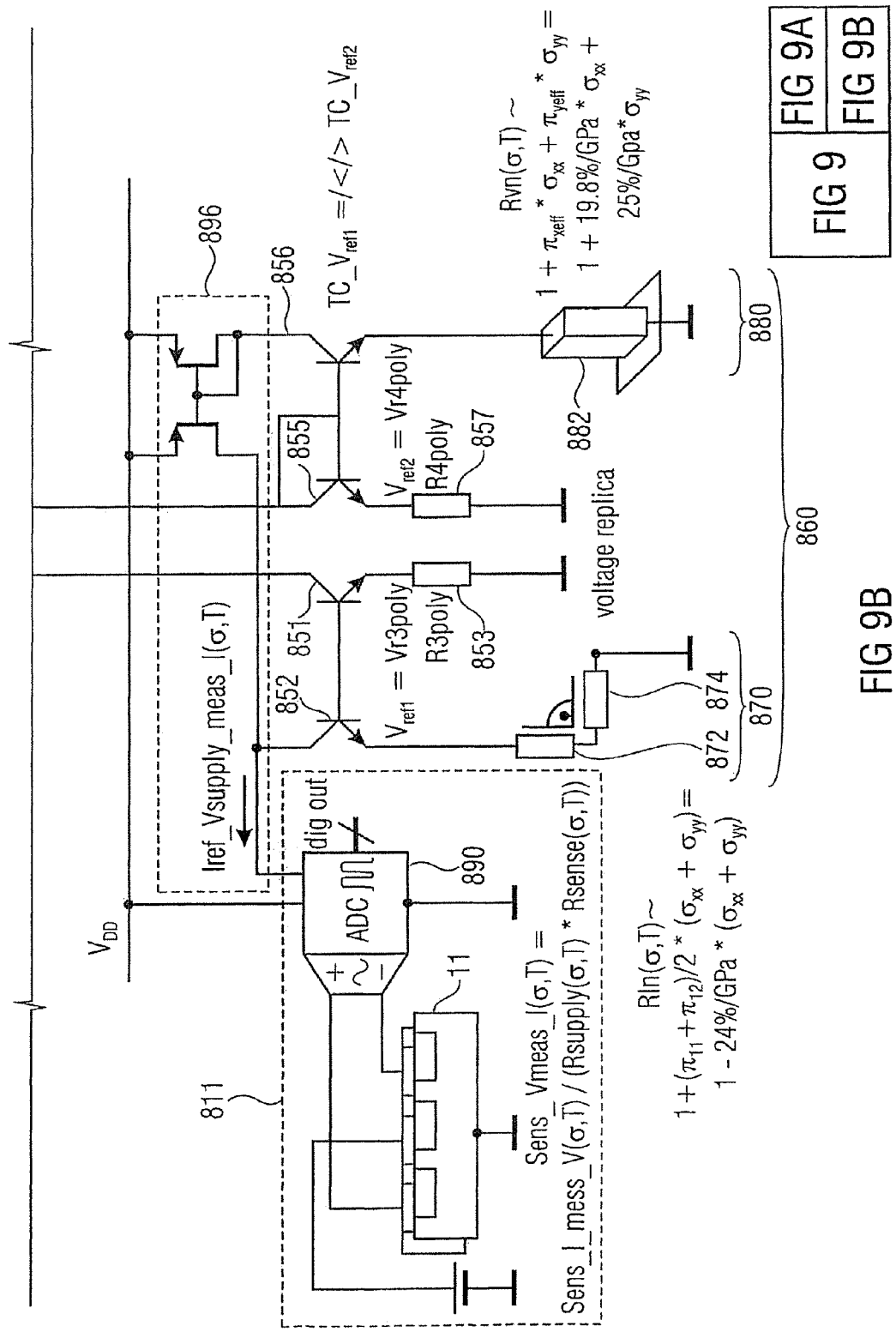

FIG. 9 shows a schematic circuit diagram of a vertical Hall sensor circuit 801 according to further embodiments. The vertical Hall sensor circuit 801 is similar to the vertical Hall sensor circuit 800 shown in FIG. 8 with the exception of a few differences. In the vertical Hall sensor circuit 801 the (measurement) arrangement 811 comprises an analog-to-digital converter 812 which is connected to the sense terminals of the vertical Hall effect region(s) 11. Note that due to the spinning current scheme which may be used for operating the vertical Hall sensor circuit 801, the sense terminals of the vertical Hall effect region(s) 11 may change from one clock phase to a subsequent clock phase of the spinning current scheme.

The vertical Hall sensor circuit 801 also comprises a voltage replica circuit similar to the voltage replica circuit 850 in FIG. 8. As a difference, the collectors of the npn transistors 852 and 856 are not connected to a common circuit node 890 as in FIG. 8, but to an output and an input, respectively, of a current mirror 896. In other words, the collector of the npn transistor 852 is connected to the output of the current mirror 896. The collector of the npn transistor 856 is connected to the input of the current mirror 896. In this manner, an output current Iref_Vsupply_meas_I($\sigma$, T) of the current mirror 896 is a subtraction of the currents flowing through the transistors 852 and 856. The output current Iref_Vsupply_meas_I($\sigma$, T) of the current mirror 896 is provided as a reference signal to the analog-to-digital converter 812. The designation "Iref_Vsupply_meas_I($\sigma$, T)" for the output current of the current mirror 896 indicates that the reference signal is a reference current which is specifically optimized for voltage bias (i.e., voltage supply) of the vertical Hall probe and current measurement of the vertical Hall probe. Accordingly, the first signal is in this embodiment a reference signal for the analog-to-digital converter 812. The current mirror 896 forms the first circuit in the embodiment shown in FIG. 9.

Figure 10:
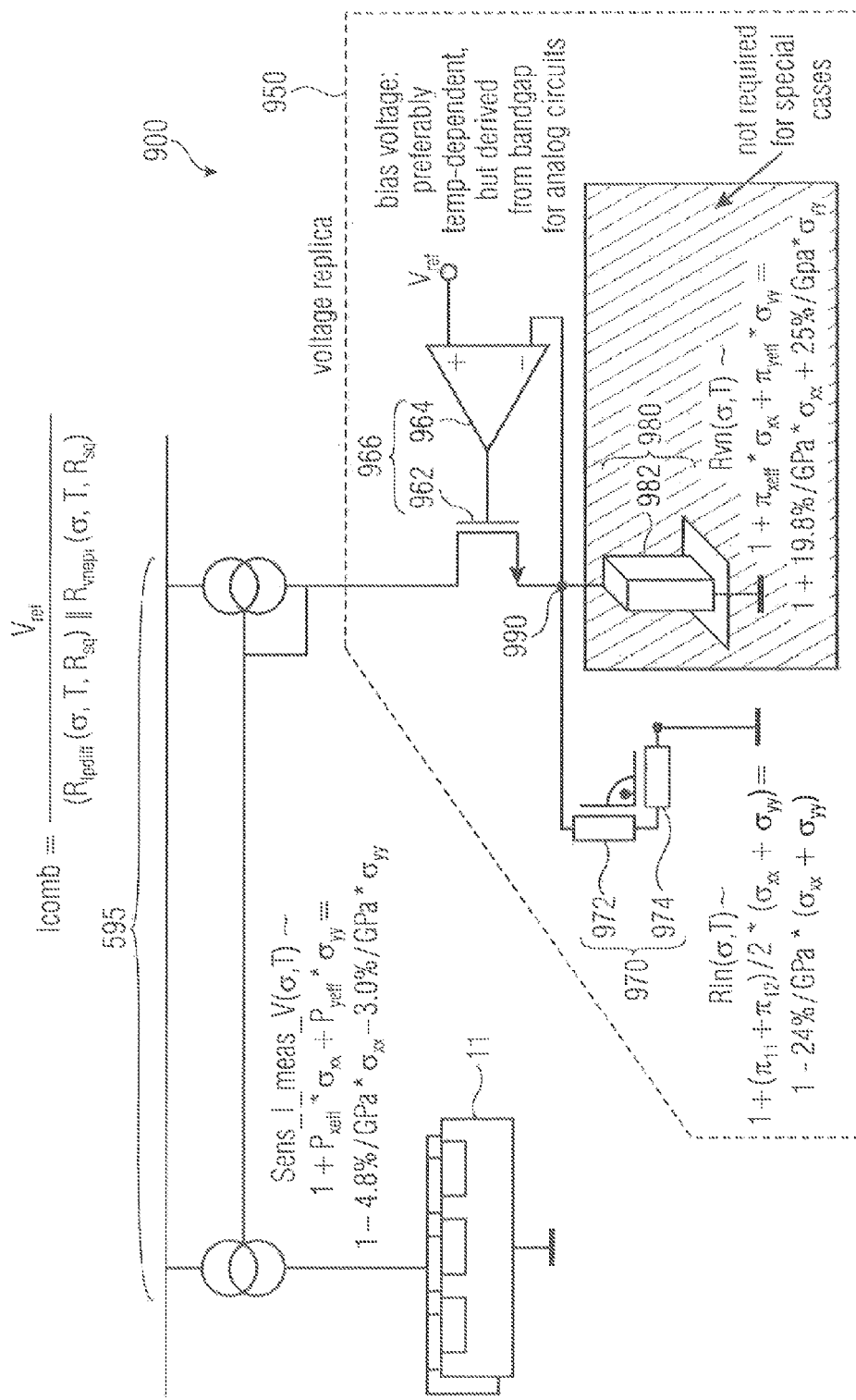
FIG. 10 shows a schematic circuit diagram of a vertical Hall sensor circuit according to further embodiments wherein the lateral resistor arrangement is p-doped (i.e., of a second doping type different from the first doping type of the vertical Hall effect region)

FIG. 10 shows a schematic circuit diagram of a vertical Hall sensor circuit 900 according to further embodiments. The concept of stress compensation is again based on the bandgap principle and a replica circuit 966. The lateral resistor arrangement 970 is of a second doping type (e.g., p-doped in case the vertical Hall effect region 11 is n-doped). The different doping types of the vertical Hall effect region 11 and the lateral resistor arrangement 970 result in a different stress compensation behavior, because a p-doped semiconductor has a different stress dependency than an n-doped semiconductor. Except for this difference, the vertical Hall sensor circuit 900 is very similar to the vertical Hall sensor circuit 500 depicted in FIG. 5 and described in connection with FIG. 5.

The stress compensation circuit 950 comprises the lateral resistor arrangement 970 of the first doping type (here: p-doped) and having a resistance Rip (where Rip stands for "resistance lateral p-doped"). The lateral resistor arrangement 970 comprises the first and second resistive elements 972, 974. Optionally, the stress compensation circuit 950 may further comprise the vertical resistor arrangement 980 with the third resistance 982. In particular, the vertical resistor arrangement may not be required for special cases, for example if the vertical Hall effect region 11 is predominantly operated in the horizontal current mode (e.g., if no highly conductive n-doped buried layer nBL is present).

The voltage replica circuit 966 comprises a MOSFET 962 and an operational amplifier 964. For an explanation of the operation of the voltage replica circuit 966 reference is made to the description of FIG. 5. The bias voltage Vref is preferably temperature dependent but, for example, derived from bandgap for analog circuits.

The combination current (comb flowing between the signal combiner 990 and the MOSFET 962 can be expressed as follows:

$$I_{comb} = \frac{V_{ref}}{(R_{lp,diff}(\sigma, T, R_{sq}))\|(R_{vn,epi}(\sigma, T, R_{sq}))}$$

The resistive elements 972, 974 of the lateral resistor arrangement 970 may be implemented and formed as diffusion-based resistors of the second doping type, e.g. p-doping. The third resistive element 982 of the vertical resistor arrangement 980 may be implemented and formed as an epitaxial resistor. Exitaxial resistors may be made with a typical bipolar process. Epitaxial resistors are so named because they are built in the expitaxial n-type silicon layer. The raw wafer is usually of a p-type material, and the expitaxial layer is deposited on the surface of the wafer by a chemical vapor deposition (CVP) process, and can be doped independently of the raw wafer. P-type isolation walls may then be implanted or diffused into the top surface of the epitaxial layer to form tubs (isolated islands) of n-type material. Maintaining each of the tubs at a positive voltage with respect to the p-type substrate causes the p-n junctions to be reverse-biased, thus electrically isolating the tubs from each other.

As an alternative to n-Epi resistors and n-Epi Hall effect regions it is also possible to use n-diffusion resistors and/or Hall effect regions. Another option would be to use n-implantation resistors and/or Hall effect regions. It is also possible to use p-diffusion and/or p-implantation resistors and/or Hall effect regions.

Figure 11:
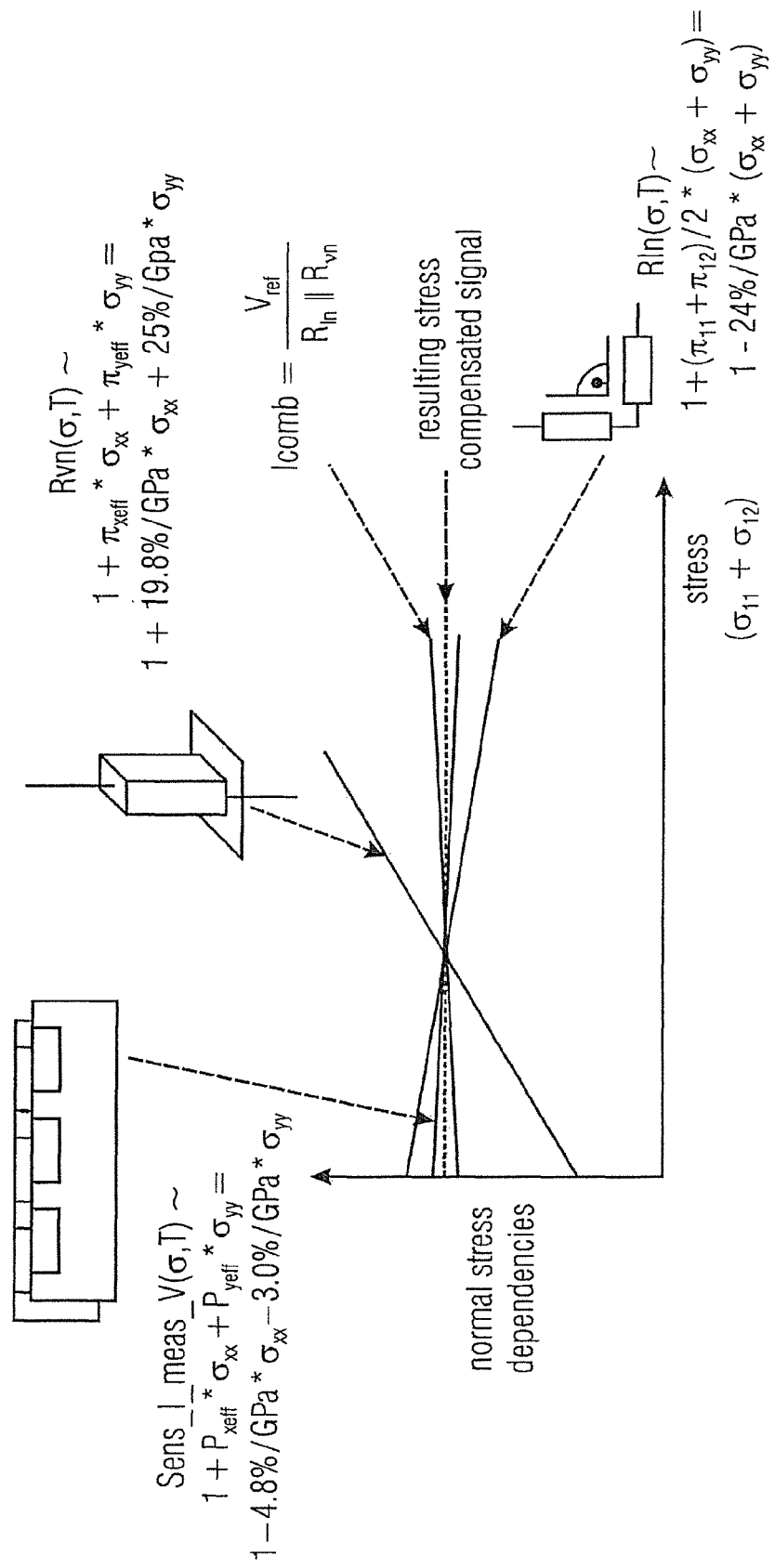
FIG. 11 shows the various stress dependencies of the components of the vertical Hall sensor circuit and the resulting stress compensated signal.

FIG. 11 graphically illustrates the stress dependencies of the vertical Hall effect region 11, the lateral resistor arrangement 170, the vertical resistor arrangement 180, and the combination current Icomb. The lateral resistor arrangement 170 is assumed to be of the first doping type, e.g. n-doped in case the vertical Hall effect region 11 is also n-doped. The abscissa of the graph corresponds to the sum of the normal stress components $\sigma_{11}+\sigma_{22}$ parallel to the substrate surface which typically are the predominant stress components.

The vertical Hall effect region 11 has a slightly negative stress dependency with increasing stress $\sigma_{11}+\sigma_{22}$. The lateral resistor arrangement Rln($\sigma$, T) has a negative stress dependency, too, yet with a stronger slope. The vertical resistor arrangement Rvn($\sigma$, T) has a strongly positive stress dependency with increasing stress $\sigma_{11}+\sigma_{22}$. Combining the stress dependencies of the lateral and vertical resistor arrangements leads to a slightly positive stress dependency for the combination current Icomb. Ideally, the slopes of the slightly positive stress dependency of the combination current Icomb and of the slightly negative stress dependency of the vertical Hall effect region 11 are approximately additive inverses so that an efficient stress compensation can be achieved by supplying the combination current Icomb or a current derived therefrom to the vertical Hall effect region 11.

Hence, a vertical Hall sensor circuit may comprise a vertical Hall effect region of a first doping type formed within a semiconductor substrate having a stress dependency with respect to a Hall effect-related electrical characteristic. The vertical Hall sensor circuit may further comprises a stress compensation circuit for stress-dependent control of a supply signal (first signal) supplied to the vertical Hall effect region. The stress compensation circuit comprises a lateral resistor arrangement, a vertical resistor arrangement, and a combiner for combining lateral and vertical contributions of an electrical quantity generated by the lateral and vertical resistor arrangements to an electrical output quantity of the stress compensation circuit. The lateral contribution has a first stress dependency and the vertical contribution has a second stress dependency of opposite sign and of different slope than the first stress dependency so that a combined stress dependency substantially compensates the stress dependency of the vertical Hall effect region.

FIGS. 12A to 12D show vertical (FIG. 12C) and lateral (FIG. 12D) n-doped reference resistors (for example, used in L-layout to cancel x-y anisotropy) and vertical Hall effect region during first and second clock phases.

Figure 12A:
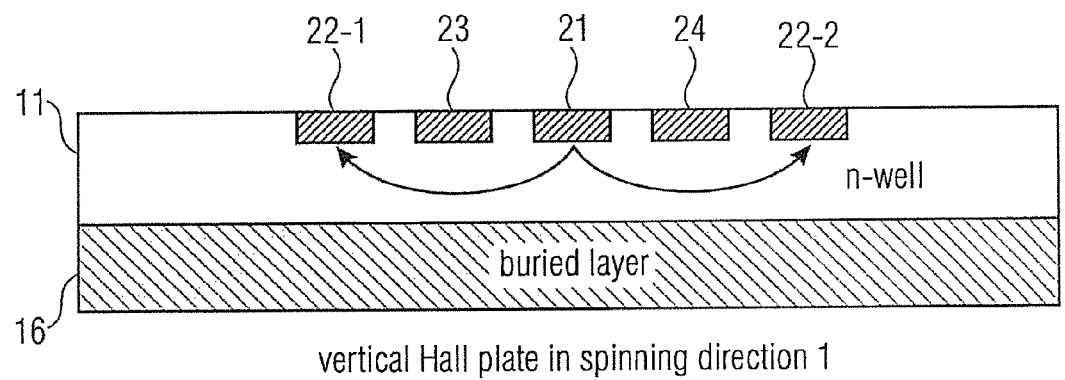
FIG. 12A shows a schematic cross-section of a vertical Hall effect region with electric current flow during the first clock phase of the spinning current scheme.
Figure 12B:
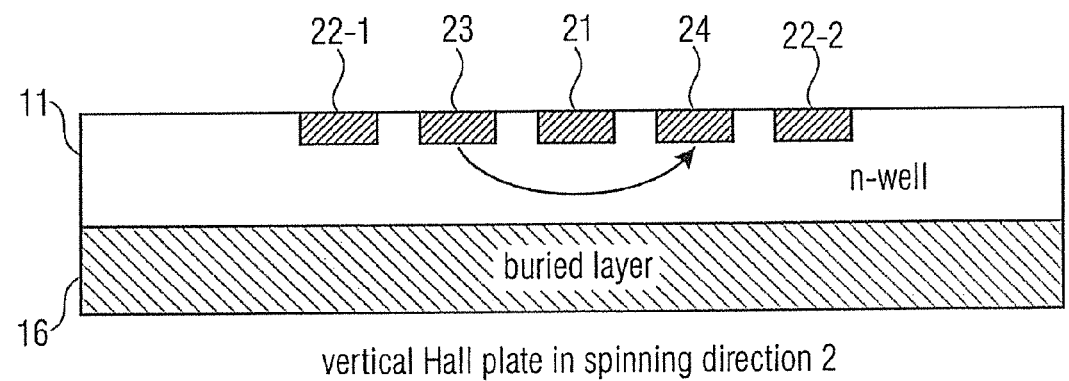
FIG. 12B shows a schematic cross-section of the vertical Hall effect region with electric current flow during the second clock phase of the spinning current scheme.

FIGS. 12A and 12B show schematic cross sections through a vertical Hall effect region 11 during a first clock phase or spinning direction 1 (FIG. 12A) and during a second clock phase or spinning direction 2 (FIG. 12B) of a spinning current scheme.

In the first clock phase depicted in FIG. 12A, the supply current entering the vertical Hall effect region 11 at contact 21 splits up into two approximately equal portions, one of which follows substantially arc-shaped current streamlines to the contact 22-1, whereas the other portion follows substantially arc-shaped current streamlines to the contact 22-2. A certain portion of the current may also flow within the buried layer 16. Thus, a first current distribution can be observed within the vertical Hall effect region during the first clock phase.

In the second clock phase depicted in FIG. 12B, the supply current entering the vertical Hall effect region 11 at contact 23 follows substantially arc-shaped current streamlines to the contact 24. A certain portion of the current may also flow within the buried layer 16. Thus, a first current distribution can be observed within the vertical Hall effect region during the first clock phase.

Figure 12C:
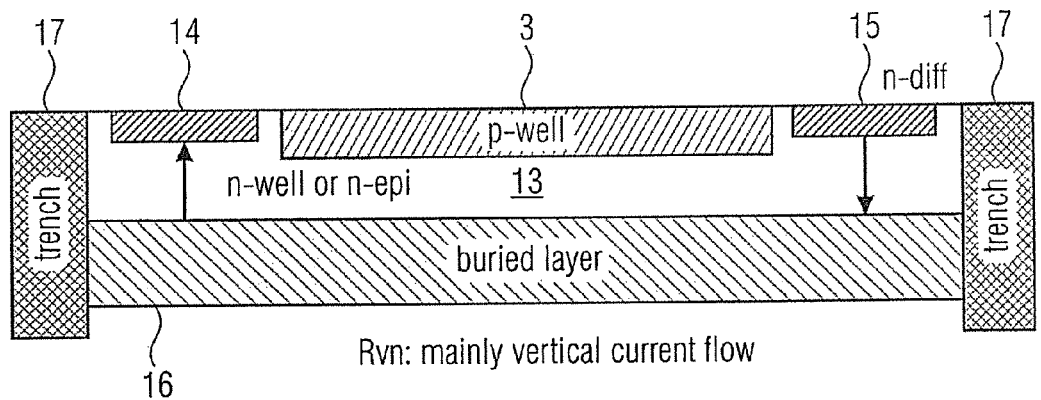
FIG. 12C shows a schematic cross-section of a vertical resistor.
Figure 12D:
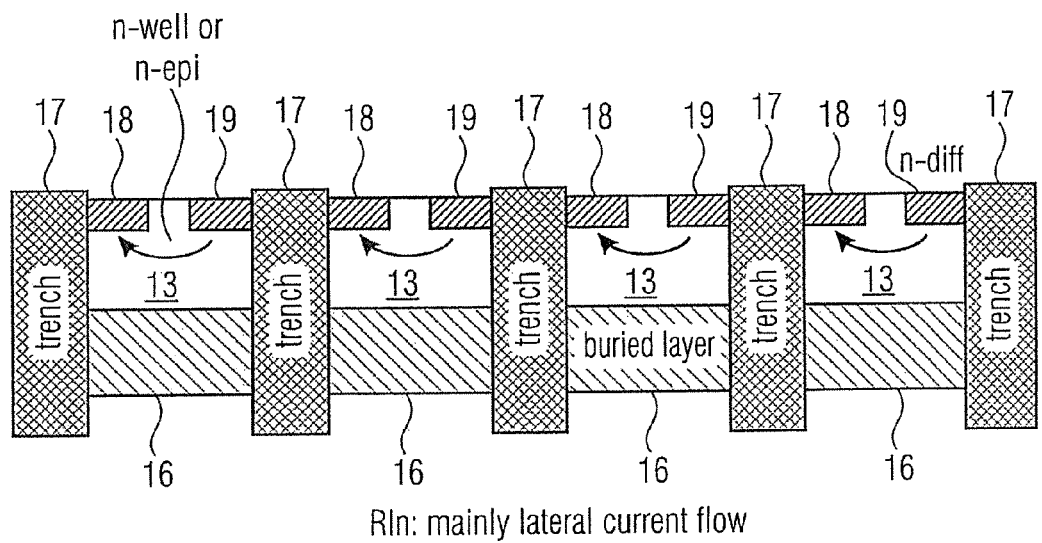
FIG. 12D shows a schematic cross-section of a lateral resistor.

FIGS. 12C and 12D show schematic cross sections of a vertical resistor Rvn (n-doped) and a lateral resistor Rln (n-doped). As can be seen in FIG. 12C, a mainly vertical current flow occurs within the vertical resistor Rvn. The current is injected into the vertical resistor Rvn at a contact 15 and extracted at a contact 14. Due to the presence of a conductive buried layer 16, the current traverses the n-well or epitaxial region 13 in a substantially vertical manner until it reaches the buried layer 16. The current then flows substantially laterally to the left within the buried layer 16 to then traverse the n-well or epitaxial layer 13 again in a substantially vertical manner until it reaches the contact 14. Note that a resistance of the buried layer 16 is typically relatively low compared with the n-well or epi layer 13 so that a possible stress dependency of the buried layer 16 does not have a big influence on the instantaneous resistance of the vertical resistor Rvn. The buried layer serves as an additional contact which is vertically spaced apart from the surface contacts 14, 15.

A p-well 3 is arranged at a surface of the n-well or epitaxial layer 13 between the contacts 14 and 15.

As can be seen in FIG. 12D, a mainly lateral current flow occurs within the lateral resistor Rln. In order to prevent the current from entering the buried layer 16, the lateral resistor Rln comprises several narrow sections which may be connected in series in order to obtain the desired resistance. Each section comprises two contacts 18, 19 which are spaced apart in a lateral direction, but not too far from each other so that a current path through the n-well or epi layer 13 still has a sufficiently low resistance that the current (largely) prefers this path through the n-well/epi layer 13 over a path leading through the buried layer 16. The sections are isolated against each other by trenches 17.

From FIGS. 12A to 12D it can be seen that the main parts of the reference resistors and of the vertical Hall effect region can be made by the same type of conductor and the same doping value to cancel technology spread variations and to allow temperature compensation via bandgap principles without the need of individual adjustment of each manufactured unit.

Figure 13:
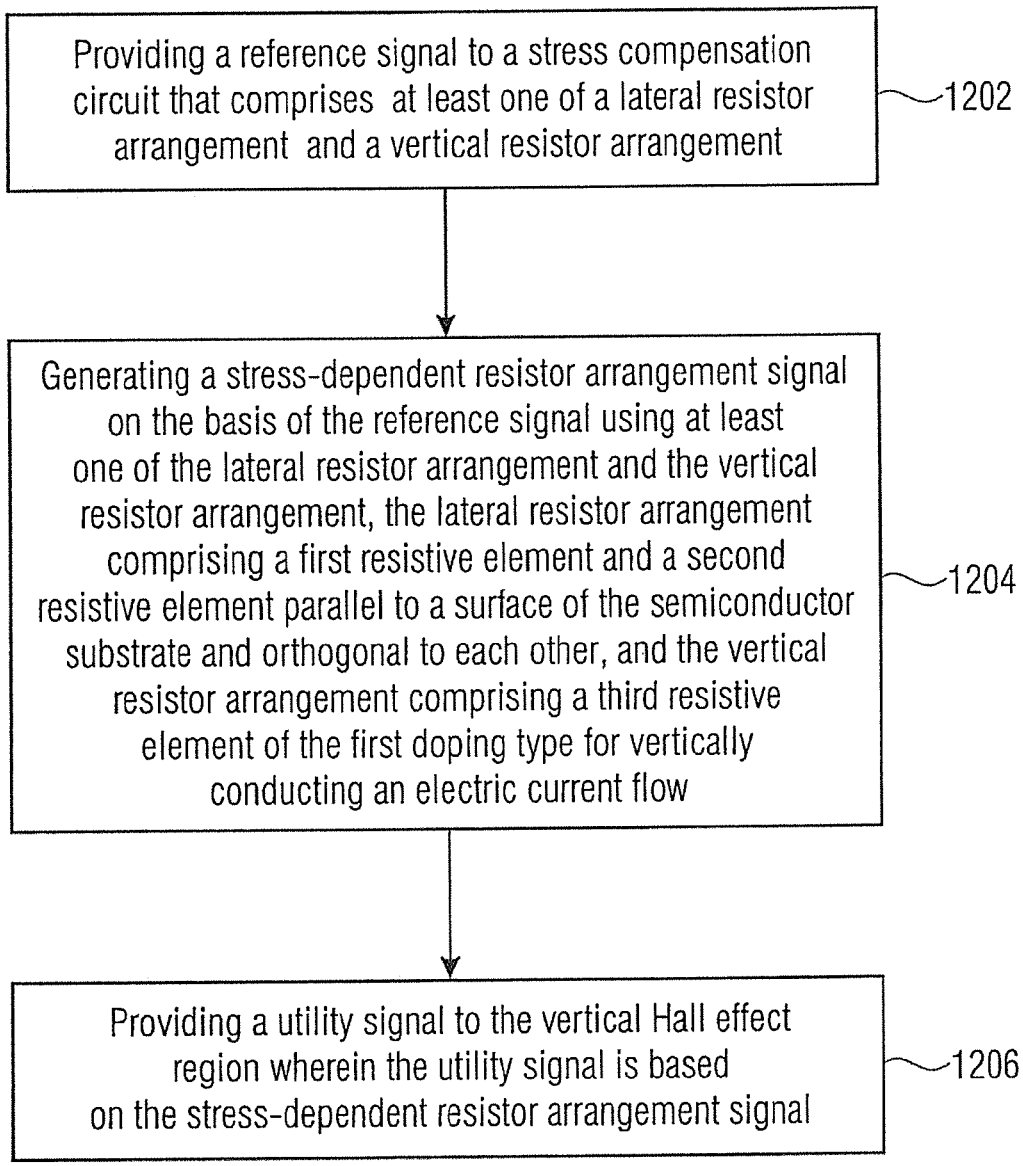
FIG. 13 shows a schematic flow diagram of a sensing method according to embodiments.

FIG. 13 shows a schematic flow diagram of a method for stress compensation of electrical power to be supplied to a vertical Hall effect region of a first doping type. The method comprises providing a reference signal to a stress compensation circuit that comprises at least one of a lateral resistor arrangement and a vertical resistor arrangement at 1202. According to some embodiments, the stress compensation circuit may comprise both a lateral resistor arrangement and a vertical resistor arrangement and also a signal combiner. The method further comprises generating a stress-dependent resistor arrangement signal based on the reference signal using at least one of the lateral resistor arrangement and the vertical resistor arrangement at 1204. If present, the lateral resistor arrangement may comprise a first resistive element and a second resistive element parallel to a surface of the semiconductor substrate and orthogonal to each other. The vertical resistor arrangement on the other hand may comprises a third resistive element of the first doping type for vertically conducting a current flow.

As indicated in FIG. 13, a first signal is provided to the vertical Hall effect region at 1206 wherein the first signal is based on the stress-dependent resistor arrangement signal.

Figure 14:
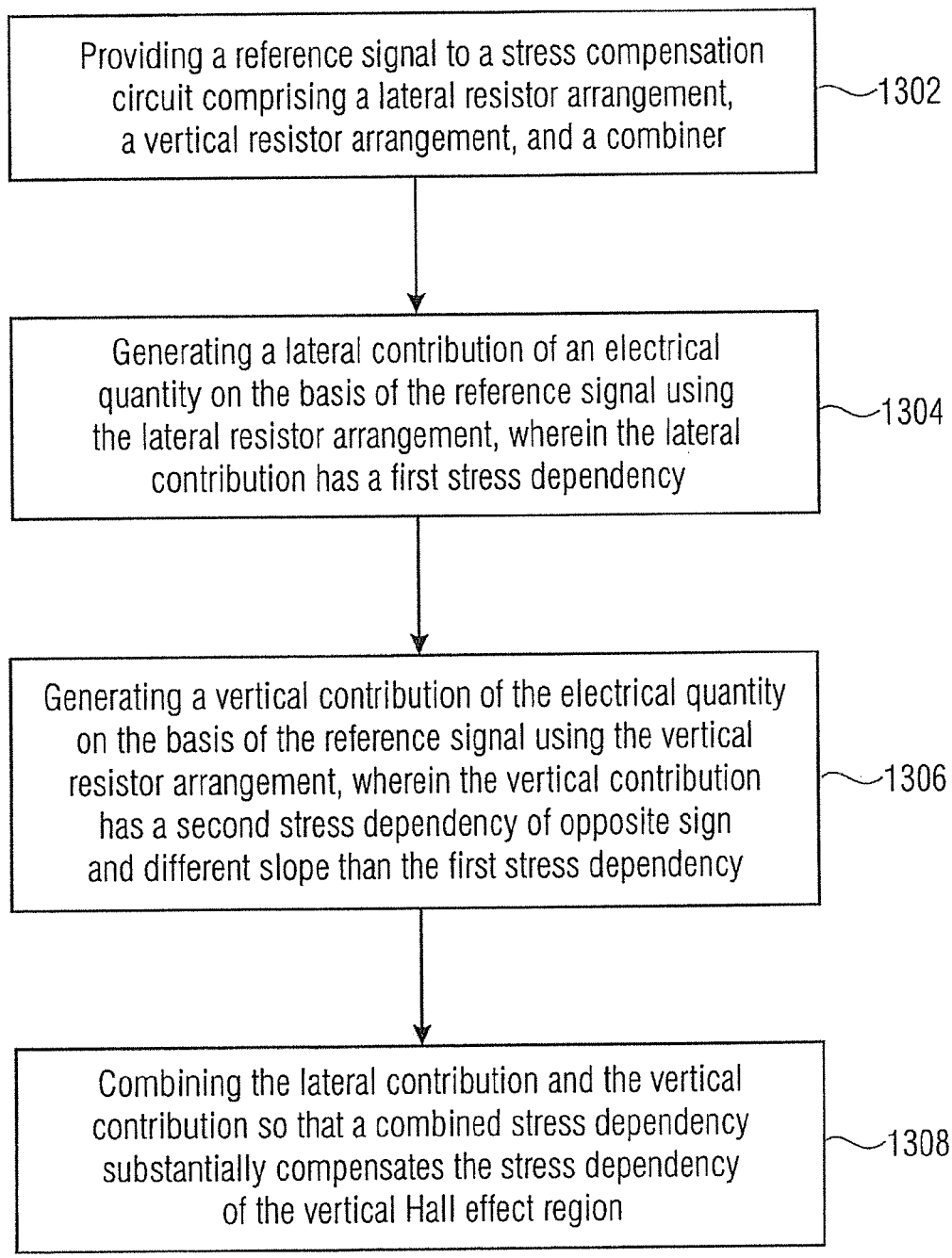
FIG. 14 shows a schematic flow diagram of a sensing method according to further embodiments.

FIG. 14 shows a schematic flow diagram of a method for stress compensation of electrical power to be supplied to a vertical Hall effect region of a first doping. The vertical Hall effect region is formed within the semiconductor substrate and has a stress dependency with respect to a Hall effect-related electrical characteristic. At 1302 of the method for stress compensation a reference signal is provided to a stress compensation circuit. The stress compensation circuit comprises a lateral resistor arrangement, a vertical resistor arrangement, and a combiner.

At 1304 of the method a lateral contribution of an electrical quantity is generated based on the reference signal using the lateral resistor arrangement. The lateral contribution has a first stress dependency.

In a similar manner a vertical contribution of the electrical quantity on the basis of the reference signal is generated at 1306 using the vertical resistor arrangement. The vertical contribution has a second stress dependency of opposite sign and different slope than the first stress dependency.

At 1308 the lateral contribution and the vertical contribution are combined so that a combined stress dependency substantially compensates the stress dependency of the vertical Hall effect region.

Figure 15:
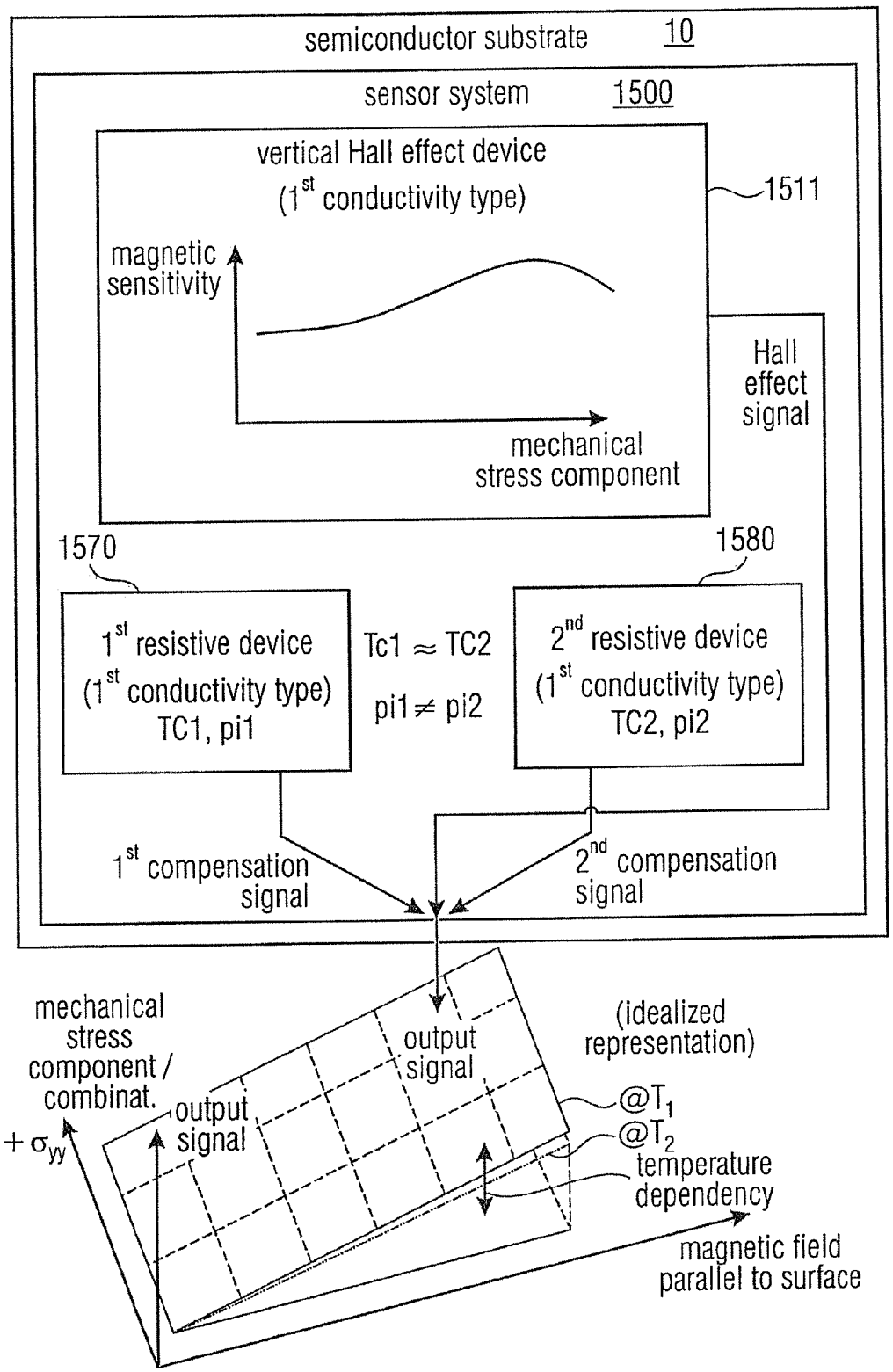
FIG. 15 shows a schematic block diagram of a sensor system according to further embodiments.

FIG. 15 shows a schematic block diagram of a sensor system 1500 according to at least some further embodiments. The sensor system comprises a vertical Hall device 1511, a first resistive device 1570, and a second resistive device 1580. These components of the 1500 sensor system are arranged or located in a same semiconductor substrate 10. Typically, other components of the sensor system 1500 are arranged or located in the semiconductor substrate 10, as well. The arrangement of the vertical Hall device 1511, the first resistive device 1570, and the second resistive device 1580 in the same semiconductor substrate 10 causes these components to be subjected to similar mechanical stress and temperature.

The vertical Hall effect device 1511 typically comprises a vertical Hall effect region, such as a n-doped well within the (p-doped) semiconductor substrate. The vertical Hall effect device 1511 may further comprise a plurality of contacts arranged at the surface of the vertical Hall effect region.

The vertical Hall effect device 1511, the first resistive device 1570, and the second resistive device 1580 mainly have a first conductivity type, for example n-doped. Of course, the first conductivity type could be a p-doping, as well, in alternative embodiments. The fact that the three components vertical Hall effect device 1511, first resistive device 1570, and second resistive device 1580 have the same conductivity type reduces process variations. The first and second resistive devices may be integrated resistors created during a semiconductor manufacturing process. In the alternative, the first and second resistive devices may be, for example field effect transistors (FETs), in particular its on-resistance $R_{DS}$ (on).

The first and second resistive devices 1570, 1580 are arranged with a well-defined mechanical stress coupling with respect to the vertical Hall effect device 1511. This means that a mechanical stress acting on the vertical Hall effect device 1511 also acts in a very similar manner on the first and second resistive devices 1570, 1580. By taking advantage of the stress dependencies of the first and second resistive devices 1570, 1580, it is possible to emulate a stress dependency (of an inverse stress dependency) of the vertical Hall effect device 1511 with a relatively high precision. To this end, the first and second compensation signals provided by the first and second resistive devices 1570, 158 may be combined in a weighted manner so that a resulting combination signal has the desired stress dependency in order to compensate for the stress dependency of the vertical Hall effect device 1511.

The vertical Hall effect device 1511 has a magnetic sensitivity that is a function of a mechanical stress component or of a combination of mechanical stress components, as graphically illustrated in FIG. 15. In addition, the vertical Hall device 1511 typically also exhibits a certain temperature dependency. The first and second resistive devices 1570, 1580 also exhibit a stress dependency and a temperature dependency. The stress dependencies of the first and second resistive devices 1570 are represented by a first piezo-coefficient pi1 for the first resistive device 1570 and by a second piezo-coefficient pi2 by the second resistive device 1580. The temperature dependencies are represented by first and second temperature coefficients TC1 and TC2, respectively. The stress dependencies pit, pi2 of the first and second resistive devices 1570, 1580 differ (much) more than the temperature dependencies TC1, TC2. This can be achieved by using different shapes and/or orientations for the active regions of the first and second resistive devices 1570, 1580.

The (normalized) difference of the temperature coefficients TC1, TC2 may be defined as dTC=abs((TC1−TC2)/(TC1+TC2)). The (normalized) difference of the piezo-coefficients may be defined as dpi=abs((pi1−pi2)/(pi1+pi2)). As an illustrative example, the following values may be assumed: TC1=4000 ppm/° C.; TC2=5000 ppm/° C.; pi1=+30%/GPa; pi2=−20%/GPa. These values yield dTC=1/9=11.1% and dpi=5/1=500%. It can be seen that dTC<<dpi. As a rule of thumb one may require dpi to be at least twice dTC.

The magnetic sensitivity of the vertical Hall effect device 1511 and the resistances of the first and second resistive devices 1570, 1580 are affected predominantly by the same (combination of) mechanical stress component(s). The components typically all react to mechanical stress $\sigma_{xx}$, $\sigma_{yy}$, $\sigma_{zz}$. The resistive devices 1570, 1580 may additionally react to $\sigma_{xy}$, i.e., a shear stress component. Typically those stress components that do not occur during normal operation can be ignored (e.g., $\sigma_{zz}$), even though the components may react to $\sigma_{zz}$ very strongly. Of the stress components that may occur, a combination may be used for stress compensation purposes which has the strongest influence, i.e., this combination of stress components multiplied with the corresponding piezo-coefficient(s) is the largest (compared to other possible stress components and their piezo-coefficient(s)). All three elements (i.e., the vertical Hall effect device 1511, the first resistive device 1570, and the second resistive device 1580) may be constituted so that for all three elements 1511, 1570, 1580 the same combination of stress components dominates within the respective properties (the magnetic sensitivity, the first resistance, and the second resistance): For example, the combination $\sigma_{xx}+\sigma_{yy}$ may have a strong influence (potentially even the strongest influence) on the magnetic sensitivity of the vertical Hall effect device and on the resistances of the first and second resistive devices. Another system, in which the magnetic sensitivity would react much stronger to $\sigma_{xx}-\sigma_{yy}$ than to $\sigma_{xx}+\sigma_{yy}$, yet the resistances would react much stronger to $\sigma_{xx}+\sigma_{yy}$ than to $\sigma_{xx}-\sigma_{yy}$, might not function in the expected manner (because the stress combination $\sigma_{xx}+\sigma_{yy}$ would be primarily measured by the resistive devices 1570, 1580, which is mostly irrelevant for the stress compensation technique at hand).

The sensor system and/or a corresponding sensor circuit is capable of substantially compensating for stress-related influences that may typically occur during normal operation.

In the lower part of FIG. 15 the dependencies of the output signal on the magnetic field component parallel to the surface of the semiconductor substrate and on the mechanical stress component combination are graphically illustrated in an idealized representation for the sake of general explanation. It can be seen that the output signal varies as a function of a strength of a magnetic field component parallel to the surface of the semiconductor substrate. The output signal has only a weak dependency on the mechanical stress component or mechanical stress component combination $\sigma_{xx}+\sigma_{yy}$, as can be seen from the substantially constant characteristic along lines of constant magnetic field.

A temperature dependency is also schematically indicated in the characteristic diagram in the lower part of FIG. 15. At a temperature T1, the output signal may be slightly higher than at a temperature T2 with otherwise identical operating parameters. The temperature dependency may also be compensated using a temperature compensation circuit as for example described above.

The magnetic sensitivity of a vertical Hall device typically may exhibit a dependency on two lateral stress components. This dependency or an inverse dependency may, inter alia, be emulated using a first resistive device and a second resistive device. In particular, a weighted combination of the contributions of the first and second resistive devices may be used to approximate the stress dependency or the inverse stress dependency of the vertical Hall device. The stress dependency (or its inverse) may also be approximated using a first resistors arrangement or a second resistor arrangement.

The sensor system may further comprise an interconnection circuit between the vertical Hall device 1511, the first resistive device 1570, and the second resistive device 1580.

The interconnection circuit may be configured to combine the first compensation signal and the second compensation signal to form a combination signal (e.g., the output signal in FIG. 15), and to provide the combination signal as a supply signal or a reference signal to the vertical Hall effect device.

The first resistive device may comprise a lateral resistor arrangement and the second resistive device may comprise a vertical resistor arrangement.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A vertical Hall sensor circuit comprising:
an arrangement comprising a vertical Hall effect region of a first doping type, formed within a semiconductor substrate and having a stress dependency with respect to a Hall effect-related electrical characteristic;
a stress compensation circuit which comprises at least one of:
a lateral resistor arrangement with a first resistive element and a second resistive element, parallel to a surface of the semiconductor substrate and orthogonal to each other, wherein the lateral resistor arrangement is configured to generate a stress-dependent lateral resistor arrangement signal based on a reference signal provided to the stress compensation circuit; and
a vertical resistor arrangement with a third resistive element and a fourth resistive element of the first doping type configured to vertically conduct an electric current flow, and generate a stress-dependent vertical resistor arrangement signal based on the reference signal, the third resistive element and the fourth resistive element both having elongate cross-sections parallel to the main surface of the semiconductor substrate and orthogonal to each other with respect to their respective longitudinal axes of the elongate cross-sections;
a first circuit configured to provide a first signal to the arrangement, wherein the first signal is based on at least one of the stress-dependent lateral resistor arrangement signal and the stress-dependent vertical resistor arrangement signal.

2. The vertical Hall sensor circuit according to claim 1, further comprising a signal combiner configured to generate a combination signal by combining the stress-dependent lateral resistor arrangement signal and the stress-dependent vertical resistor arrangement signal, wherein the combination signal is provided to the first circuit.

3. The vertical Hall sensor circuit according to claim 2, wherein the combination signal is a combined current generated by summing or subtracting a lateral resistor arrangement current corresponding to the stress-dependent lateral resistor arrangement signal and a vertical resistor arrangement current corresponding to the stress-dependent vertical resistor arrangement signal.

4. The vertical Hall sensor circuit according to claim 1, wherein the first signal is one of: a supply signal, a supply current, a supply voltage, a reference signal, a reference voltage, and a reference current.

5. The vertical Hall sensor circuit according to claim 1, wherein the arrangement comprises an analog-to-digital converter which is configured to receive the first signal as another reference signal.

6. The vertical Hall sensor circuit according to claim 1, wherein the first and second resistive elements of the lateral resistor arrangement have the first doping type.

7. The vertical Hall sensor circuit according to claim 1, wherein the first and second resistive elements of the lateral resistor arrangement have a second doping type that is different than the first doping type.

8. The vertical Hall sensor circuit according to claim 1, wherein the first circuit comprises at least one of a current mirror, a voltage replica circuit, a regulated feedback circuit, a controlled current source, and a controlled voltage source.

9. The vertical Hall sensor circuit according to claim 1, wherein the stress compensation circuit comprises a controlled current source having a control terminal connected to the reference signal and a resistor arrangement terminal connected to a combined resistor arrangement that comprises the lateral resistor arrangement and the vertical resistor arrangement so that a combination signal is an output current of the controlled current source.

10. The vertical Hall sensor circuit according to claim 1, wherein the lateral resistor arrangement and the vertical resistor arrangement are connected in parallel.

11. The vertical Hall sensor circuit according to claim 1, further comprising a temperature compensation circuit for providing the reference signal as a temperature-dependent electrical quantity to the stress compensation circuit, wherein the temperature-dependent electrical quantity is substantially independent from stress within the semiconductor substrate.

12. The vertical Hall sensor circuit according to claim 11, wherein the temperature compensation circuit comprises at least one of a proportional-to-absolute-temperature (PTAT) circuit, a negative-to-absolute-temperature (NTAT) circuit, and a bandgap circuit.

13. The vertical Hall sensor circuit according to claim 11, wherein the temperature compensation circuit comprises a proportional-to-absolute-temperature circuit, a negative-to-absolute-temperature circuit, a first controlled current source, a second controlled current source, a current combiner, and a first portion of a voltage replica circuit;
   wherein the first controlled current source is configured to receive a temperature-proportional signal from the proportional-to-absolute-temperature circuit as a control input and generate based thereupon a first temperature-dependent current to be provided to the current combiner;
   wherein the second controlled current source is configured to receive a temperature-negative signal from the negative-to-absolute-temperature circuit as another control input and generate based thereupon a second temperature-dependent current to be provided to the current combiner;
   wherein a combined temperature-dependent current generated by the current combiner based on a combination of the first and second temperature-dependent currents has a substantially opposite temperature dependency than the vertical Hall effect region; and
   wherein the combined temperature-dependent current is provided to the stress compensation circuit using the first portion of the voltage replica circuit, wherein a second portion of the voltage replica circuit is part of the stress compensation circuit.

14. The vertical Hall sensor circuit according to claim 13, wherein the first portion of the voltage replica circuit belonging to the temperature compensation circuit is connected to a reference potential by a polycrystalline resistor having a low or negligible stress dependency, and the second portion of the voltage replica circuit belonging to the stress compensation circuit is connected to the reference potential by the lateral resistor arrangement and the vertical resistor arrangement.

15. The vertical Hall sensor circuit according to claim 1, wherein the stress compensation circuit further comprises:
   a first reference current terminal;
   a second reference current terminal;
   a first reference current mirror connected on a first input side thereof to the first reference current terminal and on a first output side thereof to the lateral resistor arrangement;
   a second reference current mirror connected on a second input side thereof to the second reference current terminal and on a second output side thereof to the vertical resistor arrangement; and
   a current combiner configured to combine output currents of the first and second reference current mirrors.

16. The vertical Hall sensor circuit according to claim 15, wherein the stress compensation circuit further comprises:
   a first polycrystalline resistor connected between the first reference current mirror and a ground potential; and
   a second polycrystalline resistor connected between the second reference current mirror and the ground potential.

17. The vertical Hall sensor circuit according to claim 1, wherein the lateral resistor arrangement comprises diffusion-formed or implantation-formed resistors of a second doping type and the vertical resistor arrangement comprises at least one epitaxial resistor.

18. A vertical Hall sensor circuit comprising
   a vertical Hall effect region of a first doping type formed within a semiconductor substrate having a stress dependency with respect to a Hall effect-related electrical characteristic; and
   a stress compensation circuit for stress-dependent control of a supply signal supplied to the vertical Hall effect region, wherein the stress compensation circuit comprises a lateral resistor arrangement comprising a first resistive element and a second resistive element that extend parallel to a main surface of the semiconductor substrate and orthogonal to each other, a vertical resistor arrangement comprising a third resistive element and a fourth resistive element having elongate cross-sections parallel to the main surface of the semiconductor substrate and orthogonal to each other with respect to their respective longitudinal axes of the elongate cross-sections, and a combiner configured to combine lateral and vertical contributions of an electrical quantity generated by the lateral and vertical resistor arrangements to form a combination signal as an electrical output quantity of the stress compensation circuit;
   wherein the lateral contribution has a first stress dependency and the vertical contribution has a second stress dependency of opposite sign and of different slope than the first stress dependency so that a combined stress dependency substantially compensates for the stress dependency of the vertical Hall effect region.

19. The vertical Hall sensor circuit according to claim 18, wherein the stress compensation circuit further comprises at least one of a current mirror, a voltage replica circuit, a regulated feedback circuit, a controlled current source, and a controlled voltage source, configured to receive the electrical output quantity from the combiner.

20. The vertical Hall sensor circuit according to claim 18, wherein the stress compensation circuit comprises a controlled current source having a control terminal connected to a reference signal and a resistor arrangement terminal connected to a combined resistor arrangement that comprises the lateral resistor arrangement and the vertical resistor arrangement so that the combination signal is an output current of the controlled current source.

21. The vertical Hall sensor circuit according to claim 18, wherein the lateral resistor arrangement and the vertical resistor arrangement are connected in parallel.

22. The vertical Hall sensor circuit according to claim 18, wherein the electrical output quantity of the stress compensation circuit is a combined current generated by summing or subtracting a lateral resistor arrangement current and a vertical resistor arrangement current.

23. The vertical Hall sensor circuit according to claim 18, further comprising a temperature compensation circuit configured to provide a reference signal as a temperature-dependent electrical quantity to the stress compensation circuit, wherein the temperature-dependent electrical quantity is substantially independent from stress within the semiconductor substrate.

24. The vertical Hall sensor circuit according to claim 23, wherein the temperature compensation circuit comprises a proportional-to-absolute-temperature circuit, a negative-to-absolute-temperature circuit, a first controlled current source, a second controlled current source, a current combiner, and a first portion of a voltage replica circuit;
   wherein the first controlled current source is configured to receive a temperature-proportional signal from the proportional-to-absolute-temperature circuit as a control input and to generate based thereupon a first temperature-dependent current to be provided to the current combiner;
   wherein the second controlled current source is configured to receive a temperature-negative signal from the negative-to-absolute-temperature circuit as a control input and to generate based thereupon a second temperature-dependent current to be provided to the current combiner;

wherein a combined temperature-dependent current generated by the current combiner on the basis of a combination of the first and second temperature-dependent currents has a substantially opposite temperature dependency than the vertical Hall effect region; and wherein the combined temperature-dependent current is provided to the stress compensation circuit using the first portion of the voltage replica circuit, wherein a second portion of the voltage replica circuit is part of the stress compensation circuit.

25. The vertical Hall sensor circuit according to claim 18, wherein the stress compensation circuit further comprises:
a first reference current signal terminal;
a second reference current signal terminal;
a first reference current mirror connected on an input side thereof to the first reference current signal terminal and on an output side thereof to the lateral resistor arrangement;
a second reference current mirror connected on another input side thereof to the second reference current signal terminal and on another output side thereof to the vertical arrangement; and
a current combiner configured to combine output current of the first and second current mirrors.

26. A vertical Hall sensor circuit comprising
an arrangement comprising a vertical Hall effect region of a first doping type, formed within a semiconductor substrate and having a stress dependency with respect to a Hall effect-related electrical characteristic;
a stress compensation circuit which comprises
a lateral resistor arrangement with a first resistive element and a second resistive element, parallel to a surface of the semiconductor substrate and orthogonal to each other, for generating a stress-dependent lateral resistor arrangement signal on the basis of a reference signal inputted to the stress compensation circuit; and
a vertical resistor arrangement with a third resistive element of the first doping type for vertically conducting an electric current flow, for generating a stress-dependent vertical resistor arrangement signal on the basis of the reference signal;
a first reference current terminal;
a second reference current terminal;
a first reference current mirror connected on an input side to the first reference current terminal and on an output side to the lateral resistor arrangement;
a second reference current mirror connected on another input side to the second reference current terminal and on another output side to the vertical resistor arrangement; and
a current combiner for combining output currents of the first and second reference current mirrors;
wherein the vertical Hall sensor circuit further comprises a first circuit for providing a first signal to the arrangement, the first signal being based on the stress-dependent lateral resistor arrangement signal and the stress-dependent vertical resistor arrangement signal.

27. A vertical Hall sensor circuit comprising
a vertical Hall effect region of a first doping type formed within a semiconductor substrate having a stress dependency with respect to a Hall effect-related electrical characteristic;

a stress compensation circuit for stress-dependent control of a supply signal supplied to the vertical Hall effect region, wherein the stress compensation circuit comprises a lateral resistor arrangement, a vertical resistor arrangement, and a combiner for combining lateral and vertical contributions of an electrical quantity generated by the lateral and vertical resistor arrangements to an electrical output quantity of the stress compensation circuit, a first reference current signal terminal, a second reference current signal terminal, a first reference current mirror connected on an input side to the first reference current signal terminal and on another output side to the lateral resistor arrangement, a second reference current mirror connected on another input side to the second reference current signal terminal and on another output side to the vertical arrangement, and a current combiner for combining output current of the first and second current mirrors;
wherein the lateral contribution has a first stress dependency and the vertical contribution has a second stress dependency of opposite sign and of different slope than the first stress dependency so that a combined stress dependency substantially compensates the stress dependency of the vertical Hall effect region.

28. A vertical Hall sensor circuit comprising:
an arrangement comprising a vertical Hall effect region of a first doping type, formed within a semiconductor substrate and having a stress dependency with respect to a Hall effect-related electrical characteristic;
a stress compensation circuit which comprises at least one of:
a lateral resistor arrangement with a first resistive element and a second resistive element, parallel to a surface of the semiconductor substrate and orthogonal to each other, wherein the lateral resistor arrangement is configured to generate a stress-dependent lateral resistor arrangement signal based on a reference signal provided to the stress compensation circuit; and
a vertical resistor arrangement with a third resistive element of the first doping type configured to vertically conduct an electric current flow, and generate a stress-dependent vertical resistor arrangement signal based on the reference signal;
a first circuit configured to provide a first signal to the arrangement, wherein the first signal is based on at least one of the stress-dependent lateral resistor arrangement signal and the stress-dependent vertical resistor arrangement signal; and
a temperature compensation circuit for providing the reference signal as a temperature-dependent electrical quantity to the stress compensation circuit, wherein the temperature-dependent electrical quantity is substantially independent from stress within the semiconductor substrate, wherein the temperature compensation circuit comprises a proportional-to-absolute-temperature circuit, a negative-to-absolute-temperature circuit, a first controlled current source, a second controlled current source, a current combiner, and a first portion of a voltage replica circuit;
wherein the first controlled current source is configured to receive a temperature-proportional signal from the proportional-to-absolute-temperature circuit as a control input and generate based thereupon a first temperature-dependent current to be provided to the current combiner;

wherein the second controlled current source is configured to receive a temperature-negative signal from the negative-to-absolute-temperature circuit as another control input and generate based thereupon a second temperature-dependent current to be provided to the current combiner;

wherein a combined temperature-dependent current generated by the current combiner based on a combination of the first and second temperature-dependent currents has a substantially opposite temperature dependency than the vertical Hall effect region; and wherein the combined temperature-dependent current is provided to the stress compensation circuit using the first portion of the voltage replica circuit, wherein a second portion of the voltage replica circuit is part of the stress compensation circuit, and wherein the first portion of the voltage replica circuit belonging to the temperature compensation circuit is connected to a reference potential by a polycrystalline resistor having a low or negligible stress dependency, and the second portion of the voltage replica circuit belonging to the stress compensation circuit is connected to the reference potential by the lateral resistor arrangement and the vertical resistor arrangement.

* * * * *